(12) United States Patent
Lee

(10) Patent No.: US 12,040,022 B2
(45) Date of Patent: Jul. 16, 2024

(54) SEMICONDUCTOR MEMORY DEVICE FOR APPLYING VOLTAGE TO SELECT LINE BASED ON NUMBER OF TIMES PROGRAM LOOPS ARE PERFORMED AND METHOD OF OPERATING THE SAME

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 148 days.

(21) Appl. No.: 17/535,220

(22) Filed: Nov. 24, 2021

(65) Prior Publication Data
US 2022/0415400 A1 Dec. 29, 2022

(30) Foreign Application Priority Data
Jun. 25, 2021 (KR) .................. 10-2021-0082891

(51) Int. Cl.
*G11C 16/04* (2006.01)
*G11C 11/56* (2006.01)
*G11C 16/10* (2006.01)
*G11C 16/34* (2006.01)

(52) U.S. Cl.
CPC .......... *G11C 16/10* (2013.01); *G11C 11/5628* (2013.01); *G11C 11/5671* (2013.01); *G11C 16/3459* (2013.01)

(58) Field of Classification Search
CPC . G11C 16/10; G11C 11/5628; G11C 11/5671; G11C 16/3459; G11C 16/0483; G11C 2211/5621; G11C 16/08; G11C 16/24; G11C 16/34; G11C 16/30; G11C 16/3468; G11C 16/3418

USPC ..................................... 365/185.03
See application file for complete search history.

(56) References Cited

U.S. PATENT DOCUMENTS

| 9,373,390 B1* | 6/2016 | Lee ............... G11C 16/3459 |
| 2016/0240264 A1* | 8/2016 | Hosono ........... G11C 16/3459 |
| 2018/0040353 A1* | 2/2018 | Lee ............... G11C 11/1673 |
| 2018/0068740 A1* | 3/2018 | Lee ............... G11C 16/3459 |
| 2019/0294362 A1* | 9/2019 | Lee ............... G11C 16/08 |

FOREIGN PATENT DOCUMENTS

| KR | 1020130072083 A | 7/2013 |
| KR | 1020200098081 A | 8/2020 |

* cited by examiner

*Primary Examiner* — Tha-O H Bui
(74) *Attorney, Agent, or Firm* — WILLIAM PARK & ASSOCIATES LTD.

(57) ABSTRACT

A method of operating a semiconductor memory device includes performing a plurality of program loops for programming selected memory cells among a plurality of memory cells. Each of the plurality of program loops includes a program phase and a verify phase. The program phase includes setting a state of a select line connected to a selected memory block including the selected memory cells, wherein setting the state of the select line connected to the selected memory block comprises applying a voltage to the select line based on a program progress state of the selected memory cells, setting a state of a bit line connected to the selected memory block, applying a program voltage to a selected word line among word lines connected to the selected memory block and applying a pass voltage to an unselected word line.

20 Claims, 22 Drawing Sheets

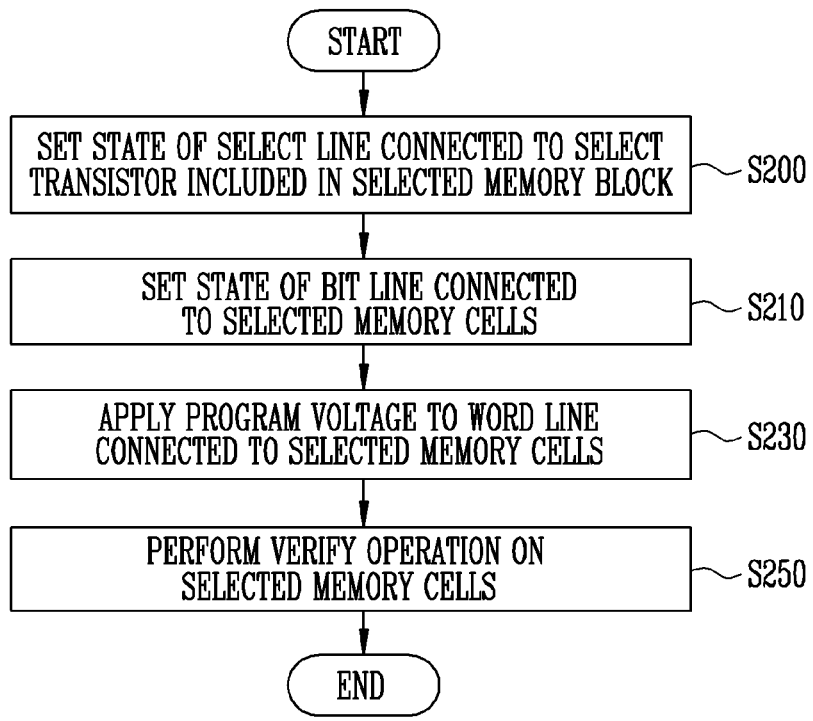
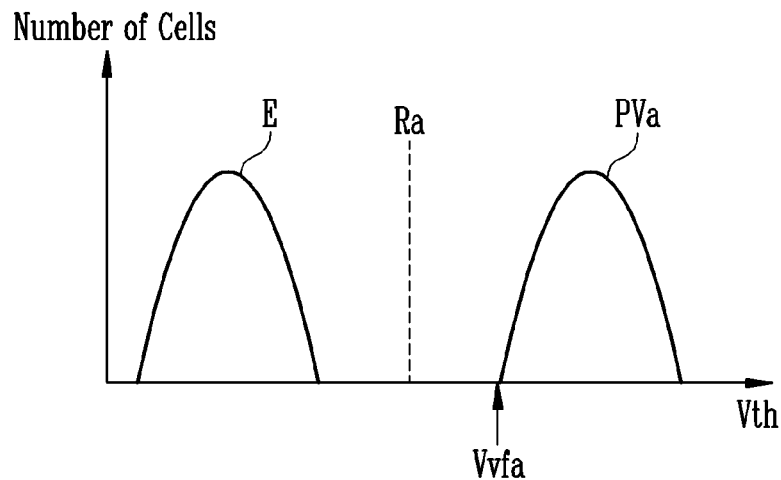

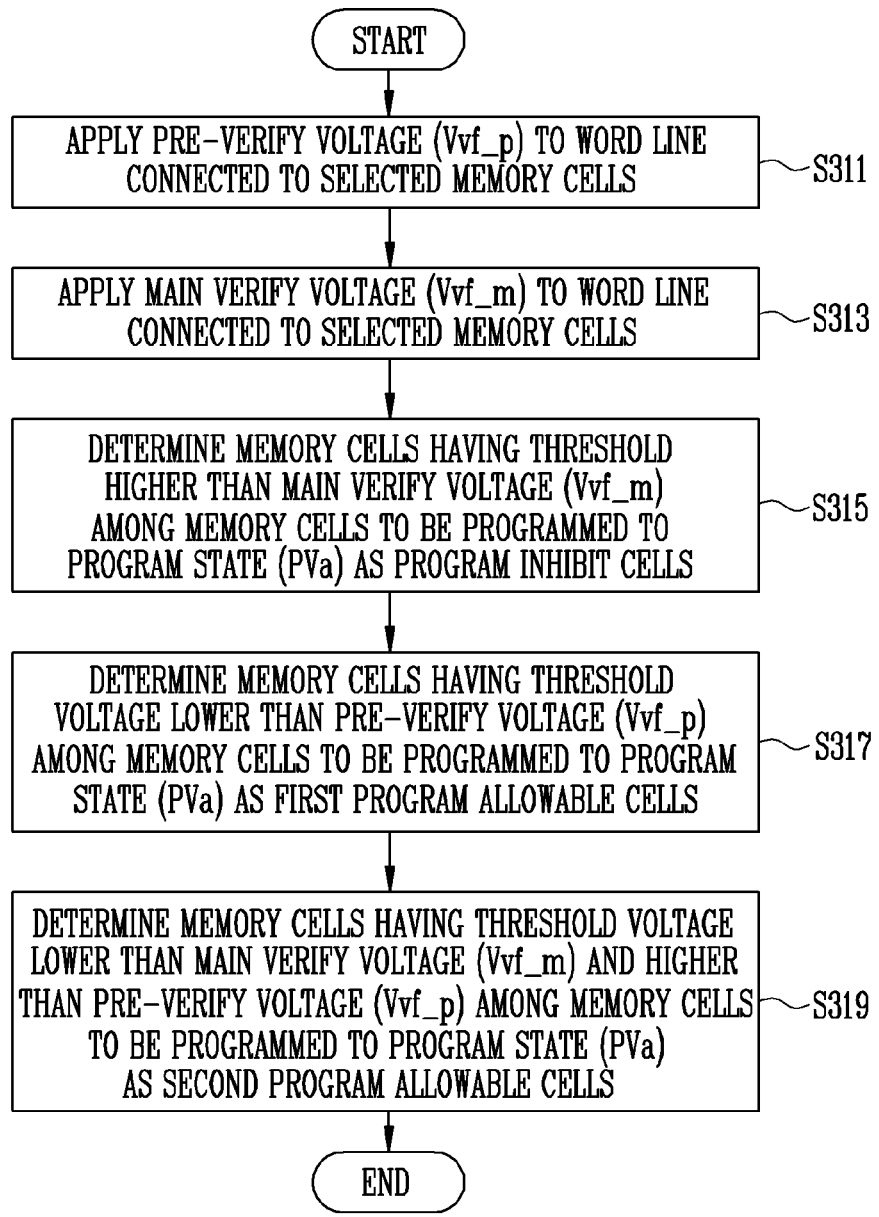

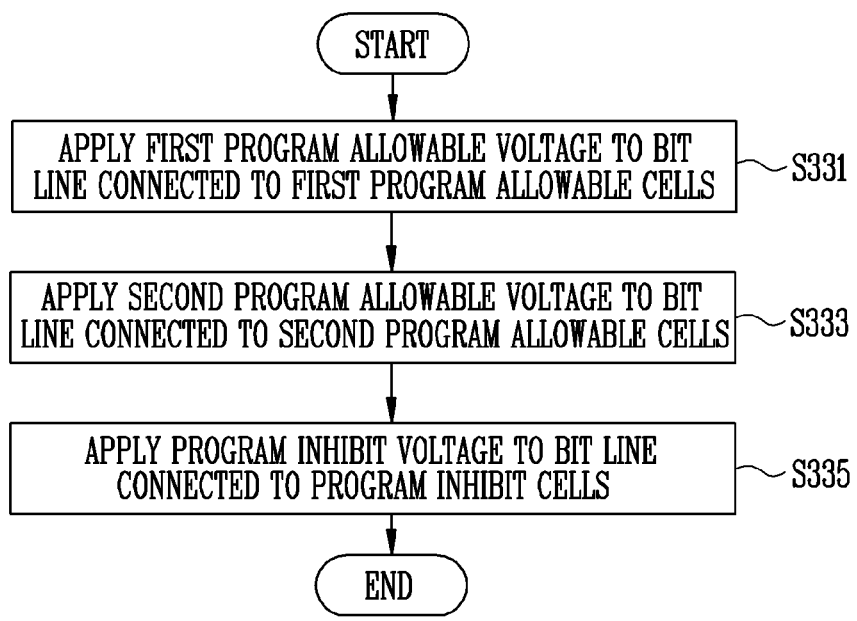
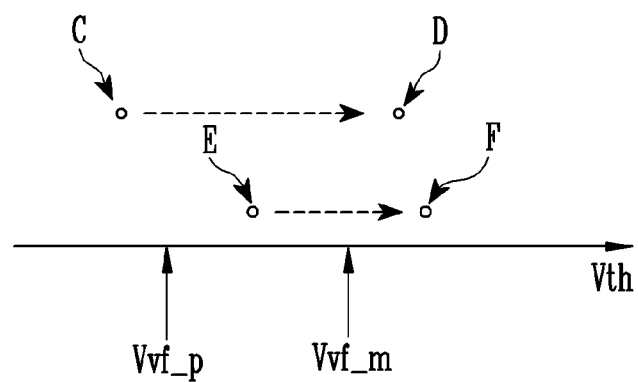

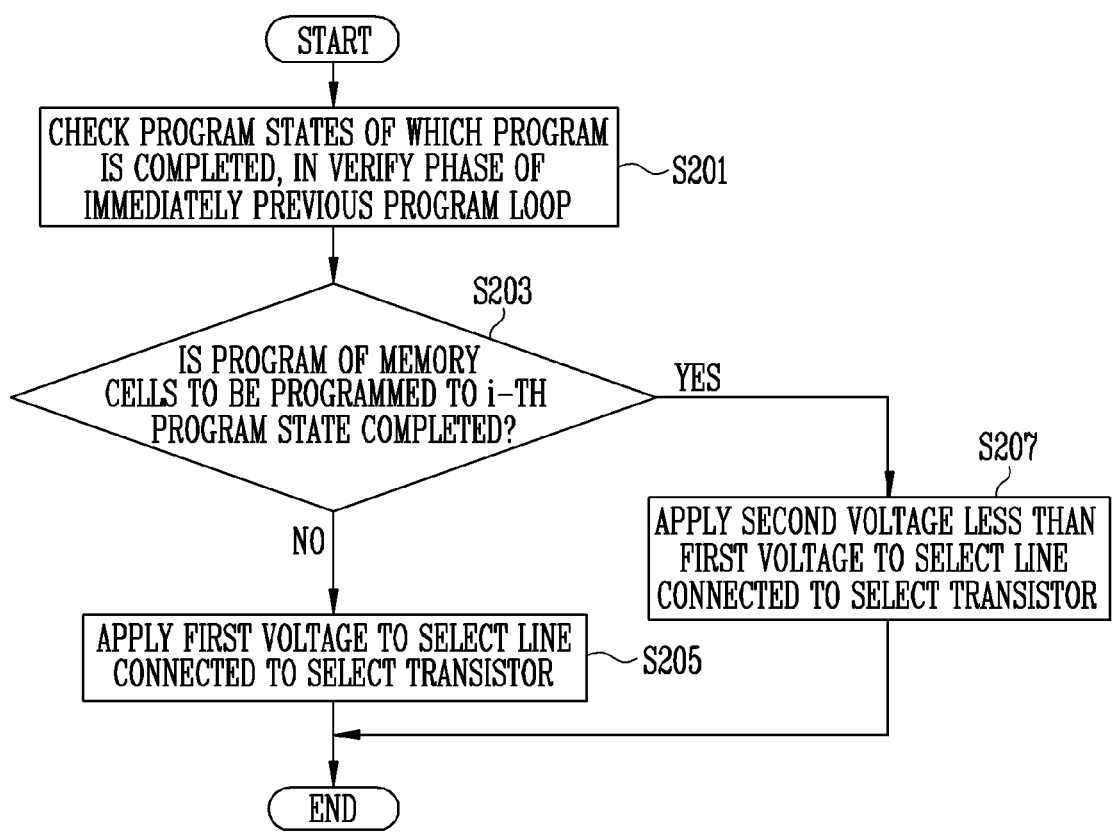

SEMICONDUCTOR MEMORY DEVICE FOR APPLYING VOLTAGE TO SELECT LINE BASED ON NUMBER OF TIMES PROGRAM LOOPS ARE PERFORMED AND METHOD OF OPERATING THE SAME

CROSS-REFERENCE TO RELATED APPLICATION

The present application claims priority under 35 U.S.C. § 119(a) to Korean patent application number 10-2021-0082891, filed on Jun. 25, 2021, which is incorporated herein by reference in its entirety.

BACKGROUND

1. Technical Field

The present disclosure relates to an electronic device, and more particularly, to a semiconductor memory device and a method of operating the same.

2. Related Art

A semiconductor memory device may be formed as a two-dimensional structure in which strings are horizontally arranged on a semiconductor substrate, or may be formed as a three-dimensional structure in which strings are vertically stacked on a semiconductor substrate. A three-dimensional semiconductor memory device is a semiconductor memory device designed to overcome a limit of an integration degree of a two-dimensional memory device, and may include a plurality of memory cells that are vertically stacked on a semiconductor substrate. A controller may control an operation of the semiconductor memory device.

SUMMARY

An embodiment of the present disclosure is directed to a semiconductor memory device and a method of operating the same, the semiconductor memory device being capable of preventing disturbance while narrowing a threshold voltage distribution width of memory cells during a program.

According to an embodiment of the present disclosure, selected memory cells among a plurality of memory cells are programmed by a method of operating a semiconductor memory device. The method includes performing a plurality of program loops. Each of the plurality of program loops includes a program phase and a verify phase. The program phase includes setting a state of a select line coupled to a selected memory block including the selected memory cells, wherein setting the state of the select line coupled to the selected memory block comprises applying a voltage to the select line based on a program progress state of the selected memory cells, setting a state of a bit line coupled to the selected memory block, applying a program voltage to a selected word line among word lines coupled to the selected memory block and applying a pass voltage to an unselected word line among the word lines coupled to the selected memory block.

In an embodiment, each of the plurality of memory cells may be capable of storing N bits of data. Setting the state of the select lines coupled to the selected memory block may include checking program states of which a program is completed in the verify phase of an immediately previous program loop, and applying a first voltage to the select line, when the program of memory cells to be programmed to an i-th program state is not completed among first to $(2^N-1)$-th program states. Here, N may be a natural number greater than 1, and i may be a natural number greater than 0 and less than $(2^N-1)$.

In an embodiment, setting the state of the select line coupled to the selected memory block may include applying a second voltage different from the first voltage to the select line, when the program of the memory cells to be programmed to the i-th program state is completed.

In an embodiment, the select line may be a drain select line.

In an embodiment, the select line may be a source select line.

In an embodiment, the second voltage may be less than the first voltage.

In an embodiment, the second voltage may be greater than the first voltage.

In an embodiment, N may be 2 and i may be 2.

In an embodiment, N may be 3 and i may be 6.

In an embodiment, the verify phase may include applying a pre-verify voltage to the word line coupled to the selected memory cells, and applying a main verify voltage greater than the pre-verify voltage to the word line coupled to the selected memory cells.

In an embodiment, the verify phase may further include determining memory cells having a threshold voltage higher than the main verify voltage as program inhibit cells.

In an embodiment, the verify phase may further include determining memory cells having a threshold voltage lower than the pre-verify voltage as first program allowable cells, and determining memory cells having a threshold voltage higher than the pre-verify voltage and lower than the main verify voltage as second program allowable cells.

In an embodiment, setting the state of the bit line coupled to the selected memory block may include applying a first program allowable voltage to a bit line coupled to the first program allowable cells, and applying a second program allowable voltage greater than the first program allowable voltage to a bit line coupled to the second program allowable cells.

In an embodiment, setting the state of the bit line coupled to the selected memory block including the selected memory cells may further include applying a program inhibit voltage greater than the second program allowable voltage to a bit line coupled to the program inhibit cells.

According to another embodiment of the present disclosure, a semiconductor memory device includes a memory block including a plurality of memory cells each capable of storing N bits of data, a peripheral circuit configured to perform a program operation on selected memory cells among the plurality of memory cells included in the memory block, and a control logic circuit configured to control the program operation performed on the selected memory cells. The program operation includes a plurality of program loops each including a program phase and a verify phase. In the program phase, the control logic circuit is configured to control the peripheral circuit to set a state of a select line coupled to the memory block based on a program progress state of the selected memory cells, to set a state of a bit line coupled to the selected memory block, and to apply a program voltage to a selected word line among word lines coupled to the selected memory block and apply a pass voltage to an unselected word line. Here, N is a natural number greater than 1.

In an embodiment, the control logic circuit may be configured to control the peripheral circuit to set the state of the select line coupled to the memory block based on the program progress state of the selected memory cells by checking program states of which a program is completed in the verify stage of an immediately previous program loop, and controlling the peripheral circuit to apply a first voltage to the select line, when the program of memory cells to be programmed to an i-th program state is not completed among first to ($2^N-1$)-th program states. Here, i may be a natural number greater than 0 and less than ($2^N-1$).

In an embodiment, the control logic circuit may be configured to set the state of the select line coupled to the memory block based on the program progress state of the selected memory cells by controlling the peripheral circuit to apply a second voltage different from the first voltage to the select line, when the program of the memory cells to be programmed to the i-th program state is completed.

In an embodiment, the select line may be a drain select line, and the second voltage may be less than the first voltage.

In an embodiment, in the verify phase, the control logic circuit may be configured to, in the verify phase, control the peripheral circuit to apply a pre-verify voltage to the word line coupled to the selected memory cells and apply a main verify voltage greater than the pre-verify voltage to the word line coupled to the selected memory cells. The control logic circuit may determine memory cells having a threshold voltage higher than the main verify voltage as program inhibit cells, determine memory cells having a threshold voltage lower than the pre-verify voltage as first program allowable cells, and determine memory cells having a threshold voltage higher than the pre-verify voltage and lower than the main verify voltage as second program allowable cells.

In an embodiment, the control logic circuit may be configured to, in process of setting the state of the bit line coupled to the selected memory block, control the peripheral circuit to apply a first program allowable voltage to a bit line coupled to the first program allowable cell, apply a second program allowable voltage greater than the first program allowable voltage to a bit line coupled to the second program allowable cell, and apply a program inhibit voltage greater than the second program allowable voltage to a bit line coupled to the program inhibit cell.

The present technology may provide a semiconductor memory device and a method of operating the same capable of preventing disturbance while narrowing a threshold voltage distribution width of memory cells during a program.

BRIEF DESCRIPTION OF THE DRAWINGS

FIG. 9 is a flowchart illustrating an embodiment of step S110 of FIG. 8.

FIG. 10 is a graph illustrating a threshold voltage distribution after a program operation of a single-level cell (SLC).

FIG. 15 is a flowchart illustrating another embodiment of step S250 of FIG. 9.

FIG. 16 is a flowchart illustrating another embodiment of step S210 of FIG. 9.

FIG. 17 is a diagram illustrating a threshold voltage of a first program allowable cell, a second program allowable cell, and a program inhibit cell.

FIG. 20 is a flowchart illustrating an embodiment of step S200 of FIG. 9.

DETAILED DESCRIPTION

Specific structural or functional descriptions disclosed in the present specification describe embodiments according to the concept of the present disclosure. These embodiments may take on various different forms and should not be construed as being limited to the specific forms described herein.

Figure 1:
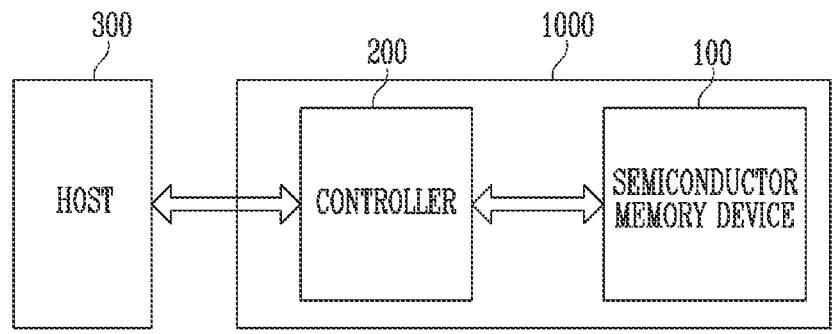
FIG. 1 is a block diagram illustrating a memory system including a semiconductor memory device and a controller according to an embodiment of the present disclosure.

FIG. 1 is a block diagram illustrating a memory system 1000 including a semiconductor memory device 100 and a controller 200 according to an embodiment of the present disclosure.

Referring to FIG. 1, the memory system 1000 includes the semiconductor memory device 100 and the controller 200. In addition, the memory system 1000 communicates with a host 300. The controller 200 controls an overall operation of the semiconductor memory device 100. In addition, the controller 200 controls the operation of the semiconductor memory device 100 based on a command received from the host 300.

Figure 2:
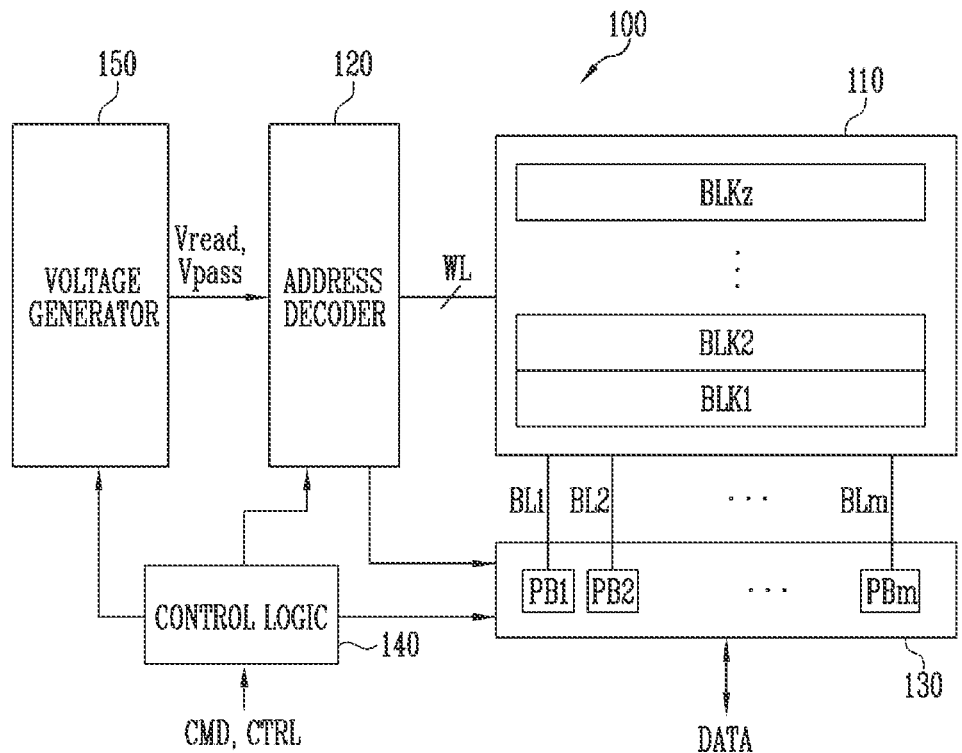
FIG. 2 is a block diagram illustrating the semiconductor memory device of FIG. 1.

FIG. 2 is a block diagram illustrating the semiconductor memory device 100 of FIG. 1.

Referring to FIG. 2, the semiconductor memory device 100 includes a memory cell array 110, an address decoder 120, a read and write circuit 130, a control logic circuit 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit that drives the memory cell array 110. The address decoder 120 is connected to the memory cell array 110 through the word lines WL. The address decoder 120 is configured to operate in response to control of the control logic circuit 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line of the selected memory block during a read operation, and applies a pass voltage Vpass to the remaining unselected word lines. In addition, the address decoder 120 applies a verify voltage generated by the voltage generator 150 to the selected word line of the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change in an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic circuit 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic circuit 140 is connected to the address decoder 120, the read and write circuit 130, and the voltage generator 150. The control logic circuit 140 receives a command CMD and a control signal CTRL through the input/output buffer (not shown) of the semiconductor memory device 100. The control logic circuit 140 is configured to control overall operations of the semiconductor memory device 100 in response to the control signal CTRL. In addition, the control logic circuit 140 outputs a control signal for adjusting a sensing node pre-charge potential level of the plurality of page buffers PB1 to PBm. The control logic circuit 140 may control the read and write circuit 130 to perform the read operation of the memory cell array 110.

The voltage generator 150 generates the read voltage Vread and the pass voltage Vpass during the read operation in response to the control signal output from the control logic circuit 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic circuit 140. As described above, the voltage generator 150 may include the charge pump, and the charge pump may include the plurality of pumping capacitors described above. A specific configuration of the charge pump included in the voltage generator 150 may be variously designed as necessary.

The address decoder 120, the read and write circuit 130, and the voltage generator 150 may function as a "peripheral circuit" that performs the read operation, the write operation, and an erase operation on the memory cell array 110. The peripheral circuit performs the read operation, the write operation, and the erase operation on the memory cell array 110 based on the control of the control logic circuit 140.

Figure 3:
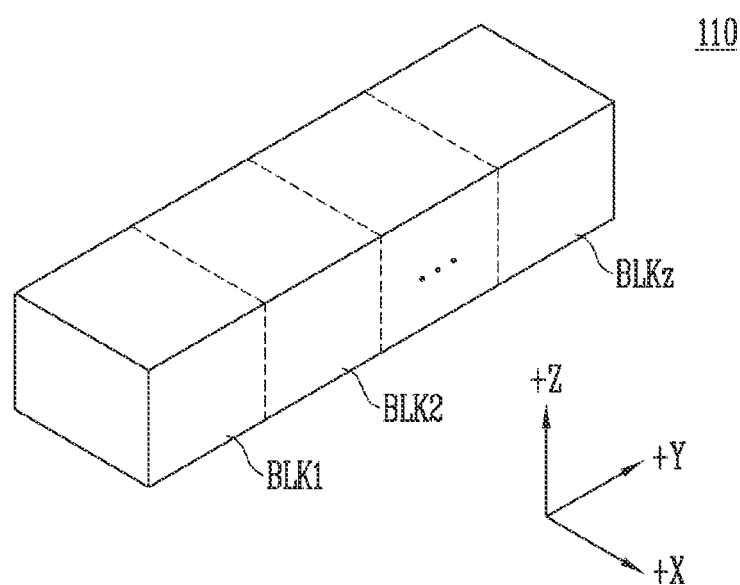
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4 and 5.

Figure 4:
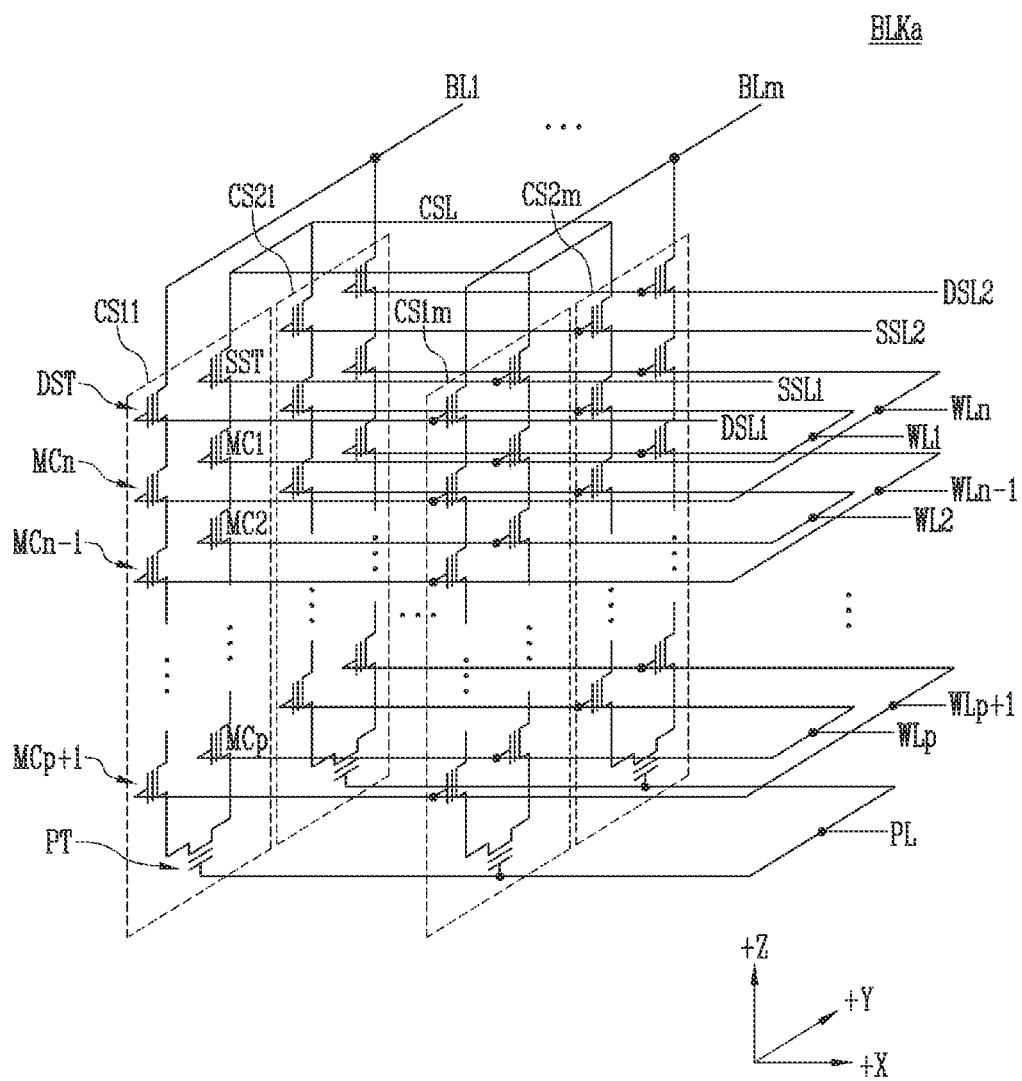
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1*m* of a first row are connected to a first source select line SSL1. The source select transistors of the cell strings CS21 to CS2*m* of a second row are connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistor of the cell strings arranged in the row direction is connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1*m* or CS21 to CS2*m* arranged in the row direction may be connected to the even bit lines, and odd-numbered cell strings among the cell strings CS11 to CS1*m* or CS21 to CS2*m* arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, the reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or some of the dummy memory cells may be performed. When the erase operation is performed after the program operation is performed, the dummy memory cells may have the required threshold voltage by controlling a voltage applied to dummy word lines connected to the respective dummy memory cells.

Figure 5:
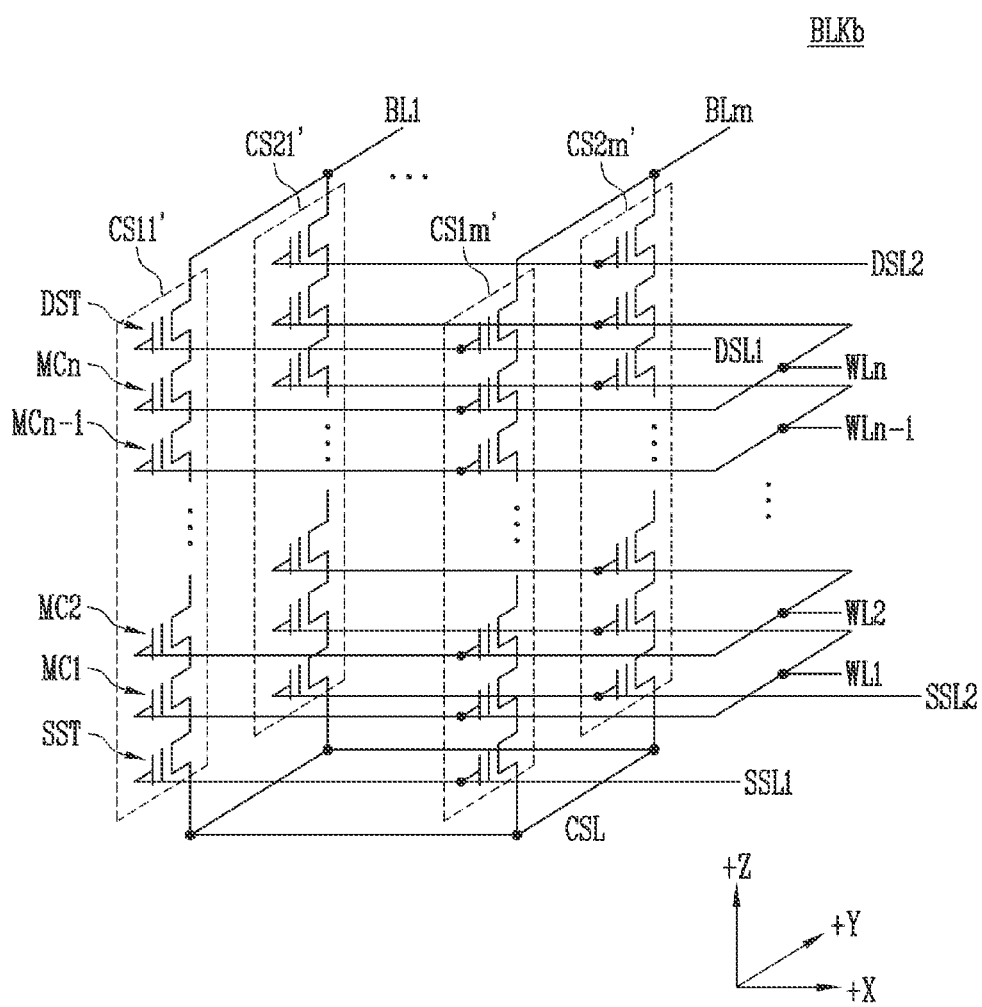
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 represents a circuit similar to the circuit of the memory block BLKa of FIG. 4 except that the pipe transistor PT is excluded from each cell string of the memory block BLKb.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, the reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
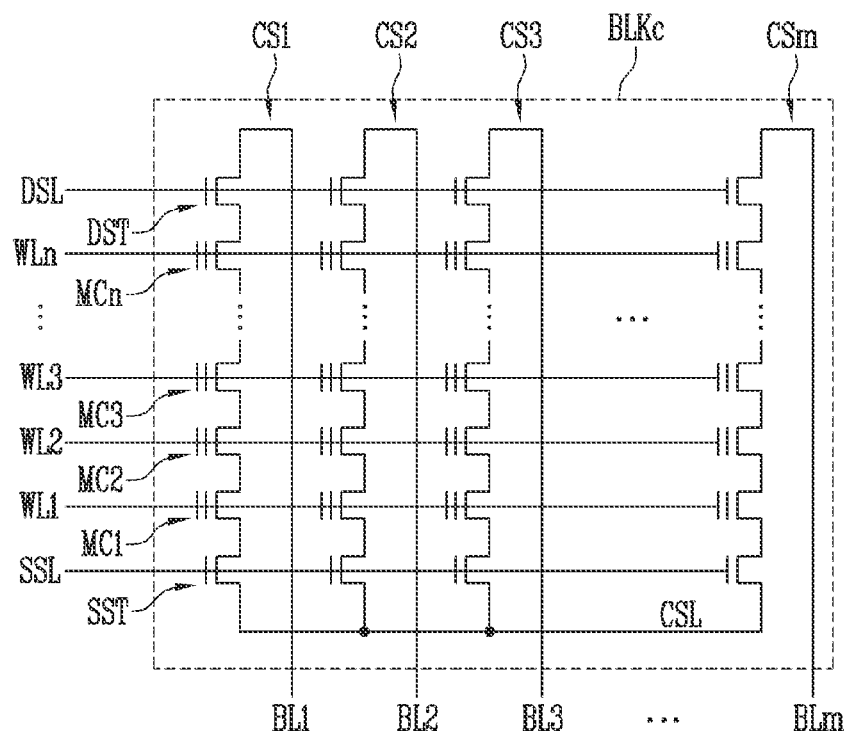
FIG. 6 is a circuit diagram illustrating an embodiment of any one memory block BLKc among the plurality of memory blocks BLK1 to BLKz included in the memory cell array 110 of FIG. 2.

FIG. 6 is a circuit diagram illustrating an embodiment of any one memory block BLKc among the plurality of memory blocks BLK1 to BLKz included in the memory cell array 110 of FIG. 2.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
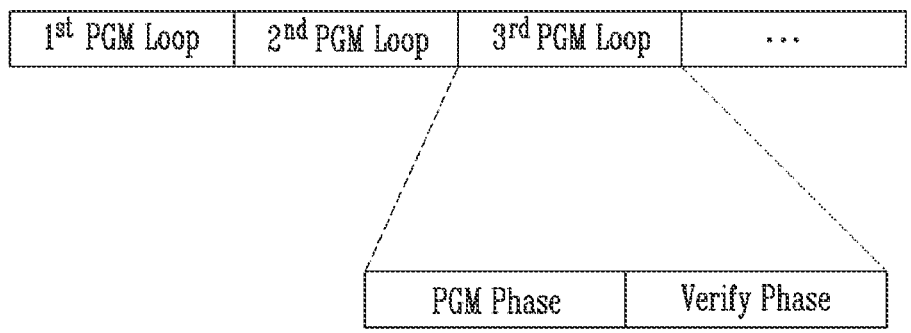
FIG. 7 is a diagram illustrating a plurality of program loops included in a program operation, and a program phase and a verify phase included in each program loop.

FIG. 7 is a diagram illustrating a plurality of program loops included in the program operation, and a program phase and a verify phase included in each program loop.

Referring to FIG. 7, the program operation may include the plurality of program loops. As shown in FIG. 7, the program operation may be started by performing a first program loop $1^{st}$ PGM Loop. When a program on selected memory cells is not completed even though the first program loop $1^{st}$ PGM Loop is performed, a second program loop $2^{nd}$ PGM Loop may be performed. When the program on the selected memory cells is not completed even though the second program loop $2^{nd}$ PGM Loop is performed, a third program loop $3^{rd}$ PGM Loop may be performed. In such a method, the program loops may be repeatedly performed until the program operation is completed.

Meanwhile, when the program operation is not completed even though the program loop is repeated up to a predetermined maximum number of times, it may be determined that the program operation has failed.

Figure 8:
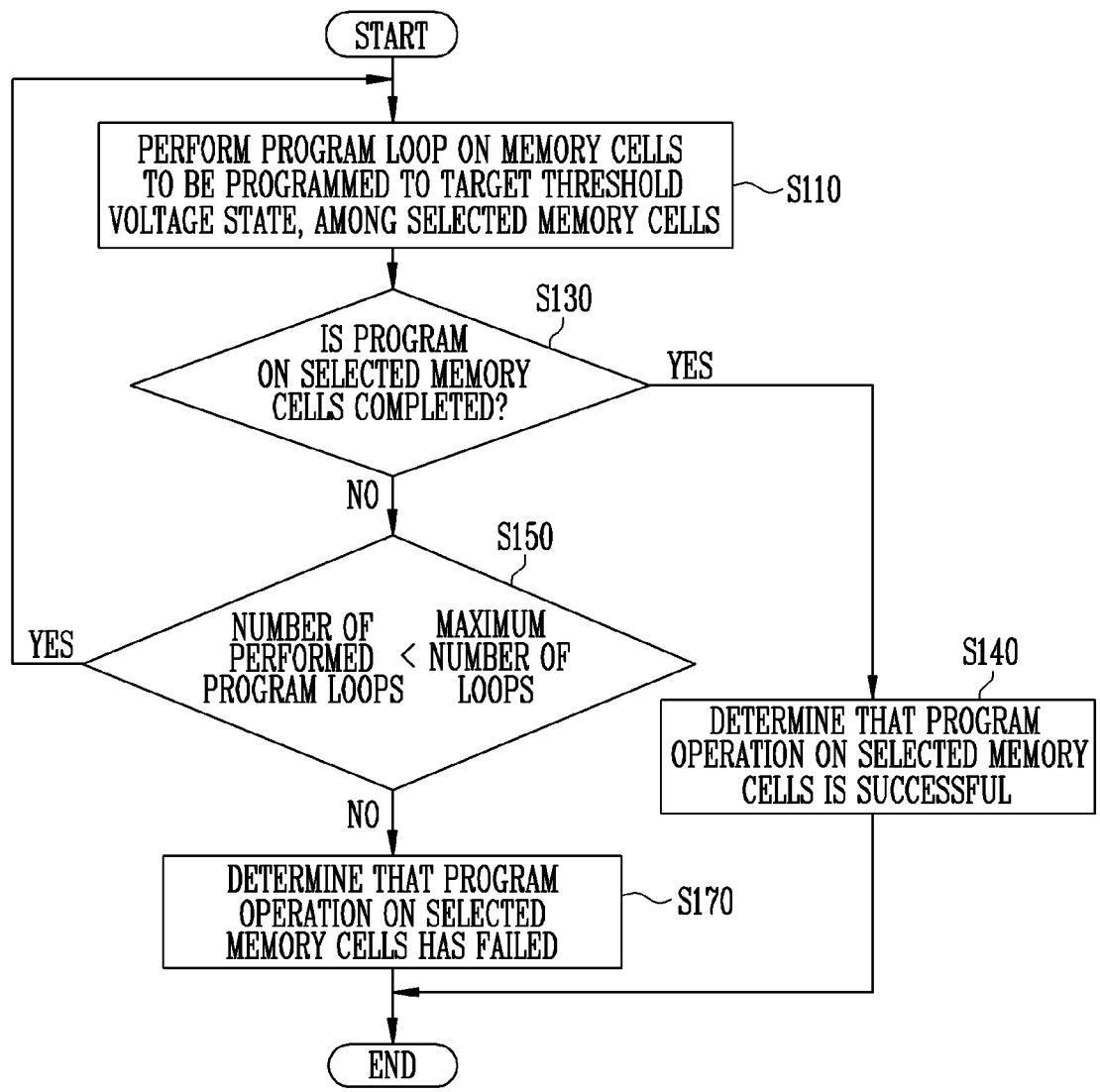
FIG. 8 is a flowchart illustrating a method of operating a semiconductor memory device according to an embodiment of the present disclosure.

FIG. 8 is a flowchart illustrating a method of operating a semiconductor memory device according to an embodiment of the present disclosure. The selected memory cells are programmed by the method of operating the semiconductor memory device according to an embodiment of the present disclosure. Referring to FIG. 8, the method includes performing a program loop on memory cells to be programmed to a target threshold voltage state among the selected memory cells (S110), and determining whether a program on the selected memory cells is completed (S130). Step S110 includes an operation of adjusting a voltage of a bit line connected to a program allowable cell and a program inhibit cell among the selected memory cells, respectively, and increasing a threshold voltage of the program allowable cell by applying a program voltage to a word line connected to the program allowable cell. In addition, step S110 further includes an operation of determining whether the threshold voltage of each memory cell is greater than the verify voltage by applying the verify voltage to the word line connected to the selected memory cells, after applying the program voltage to the word line connected to the selected memory cells. Embodiments of step S110 are described in more detail with reference to FIG. 9.

Meanwhile, the method of operating the semiconductor memory device according to an embodiment of the present disclosure further includes determining that the program operation on the selected memory cells is successful (S140) when the program on the selected memory cells is completed (S130: Yes).

In addition, the method of operating the semiconductor memory device according to an embodiment of the present disclosure further includes determining whether the number of program loops performed so far is less than a maximum number of loops (S150) when the program on the selected memory cells is not completed (S130: No). During the program operation on the selected memory cells, the program loop of step S110 may be performed a plurality of times. However, in order to prevent the program loop for the selected memory cells from being repeated indefinitely, the maximum number of loops may be set. Whenever the program loop is performed, the number of performed program loops increases by one. In a case where the program on the selected memory cells is not completed (S130: No), when the number of performed program loops is less than the maximum number of loops (S150: Yes), the method returns to step S110 and the program loop is performed once again.

Meanwhile, the method of operating the semiconductor memory device according to an embodiment of the present disclosure further includes determining that the program operation on the selected memory cells has failed (S170) when the number of program loops performed so far is not less than the maximum number of loops (S150: No). That is, in a case where the program on the selected memory cells is not completed (S130: No), when the number of performed program loops is greater than or equal to the maximum number of loops (S150: No), the program loop is not performed any more and it is determined that the program operation on the selected memory cells has failed (S170).

As described above, in accordance with the method of operating the semiconductor memory device according to an embodiment of the present disclosure, the program loop is repeatedly performed until the program on the selected memory cells is completed. However, when the program is not completed even though the number of program loops performed so far reaches the maximum number of loops, it is determined that the program operation on the selected memory cells has failed.

Figure 11:
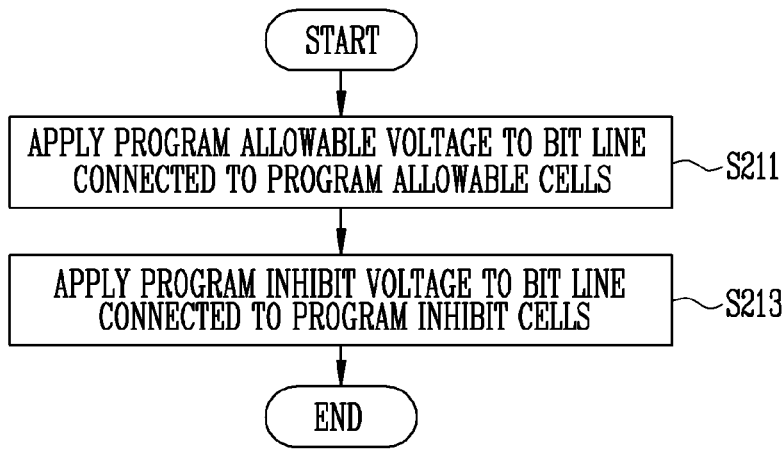
FIG. 11 is a flowchart illustrating an embodiment of step S210 of FIG. 9.

FIG. 9 is a flowchart illustrating an embodiment of step S110 of FIG. 8 in more detail. FIG. 10 is a graph illustrating a threshold voltage distribution after the program operation of the SLC. FIG. 11 is a flowchart illustrating an embodiment of step S210 of FIG. 9 in more detail. Hereinafter, a step of setting a state of a bit line connected to the selected memory cells is described with reference to FIGS. 9 to 11 together.

Referring to FIG. 9, performing the program loop on the memory cells to be programmed to the target threshold voltage state among the selected memory cells (S110) includes setting a state of a select line connected to a select transistor included in the selected memory block, (S200), setting a state of the bit line connected to the selected memory cells (S210), applying the program voltage to the word line connected to the memory cells (S230), and performing a verify operation on the selected memory cells (S250).

In the present specification, the select line may mean at least one of the drain select line DSL and the source select line SSL described with reference to FIGS. 4 to 6. That is, in step S200, a state of at least one of the drain select line DSL and the source select line SSL connected to the selected memory block including the program target memory cells may be set. More specifically, in step S200, a specific voltage may be applied to at least one of the drain select line DSL and the source select line SSL connected to the selected memory block.

Among the selected memory cells, one or more memory cells for which a threshold voltage is increased in a current program loop are the program allowable cells, and one or more memory cells for which a threshold voltage is maintained are the program inhibit cells. Both of the program allowable cells and the program inhibit cells are applied to the same word line. When the program voltage is applied to the word line, a voltage of the bit line is adjusted to increase the threshold voltage of the program allowable cells and maintain the threshold voltage of the program inhibit cells. In step S210, the voltage of the bit line connected to the program allowable cells and the voltage of the bit line connected to the program inhibit cells are adjusted. As shown in FIG. 11, step S210 includes applying a program allowable voltage to the bit line connected to the program allowable cells (S211) and applying a program inhibit voltage to the bit line connected to the program inhibit cells (S213). In an embodiment, the program inhibit voltage may be greater than the program allowable voltage. For example, the program allowable voltage may be a ground voltage. Meanwhile, in FIG. 11, step S213 is performed after step S211 is performed, however the present disclosure is not limited thereto. That is, according to an embodiment, step S211 may be performed after step S213 is performed, or step S211 and step S213 may be performed simultaneously.

Referring to FIG. 10, after the program operation of the SLC, the threshold voltage distribution may be divided into an erase state E and a program state PVa. During the read operation, it is determined whether the memory cells are in the erase state E or the program state PVa by a read voltage Ra. Meanwhile, the threshold voltage of the memory cells to be programmed to the program state PVa is greater than a verify voltage Vvfa.

At an initial stage of the program operation, all of the selected memory cells may have the threshold voltage of the erase state E. Among the selected memory cells, memory cells required to be maintained in the erase state E become the program inhibit cells from the initial stage of the program operation. Meanwhile, among the selected memory cells, all of the memory cells to be programmed to the program state PVa become the program allowable cells at the initial stage of the program operation.

In a state in which the program allowable voltage is applied to the bit line connected to the program allowable cells (S211) and the program inhibit voltage is applied to the bit line connected to the program inhibit cells (S213), when the program voltage is applied to the word line connected to the selected memory cells (S230), the threshold voltage of the program allowable cells increases, and the threshold voltage of the program inhibit cells are maintained. Thereafter, it is determined whether the threshold voltage of the memory cells to be programmed to the program state PVa is greater than the verify voltage Vvfa, respectively, by performing the verify operation on the selected memory cells (S250).

As described above, at the initial stage of the program operation, all of the threshold voltages of the memory cells to be programmed to the program state PVa may be less than the verify voltage Vvfa. Therefore, all of the memory cells to be programmed to the program state PVa become the program allowable cells at the initial stage of the program operation. As the program loop is repeatedly performed, the threshold voltage of the program allowable cells increases. Accordingly, the threshold voltage of some program allowable cells becomes greater than the verify voltage Vvfa. In performing the verify operation on the selected memory cells (S250), the state of the program allowable cells having the threshold voltage greater than the verify voltage Vvfa is changed to the program inhibit cell. Therefore, the threshold voltage of the corresponding memory cells is no longer increased in a subsequent program loop.

Meanwhile, according to an embodiment of the present disclosure, the program operation may be performed using an incremental step pulse programming (ISPP) method. The ISPP method is a method of programming memory cells while gradually increasing a program voltage. As the program loop is repeated, the program voltage applied to the word line connected to the memory cells selected in step S230 may gradually increase.

Figure 12:
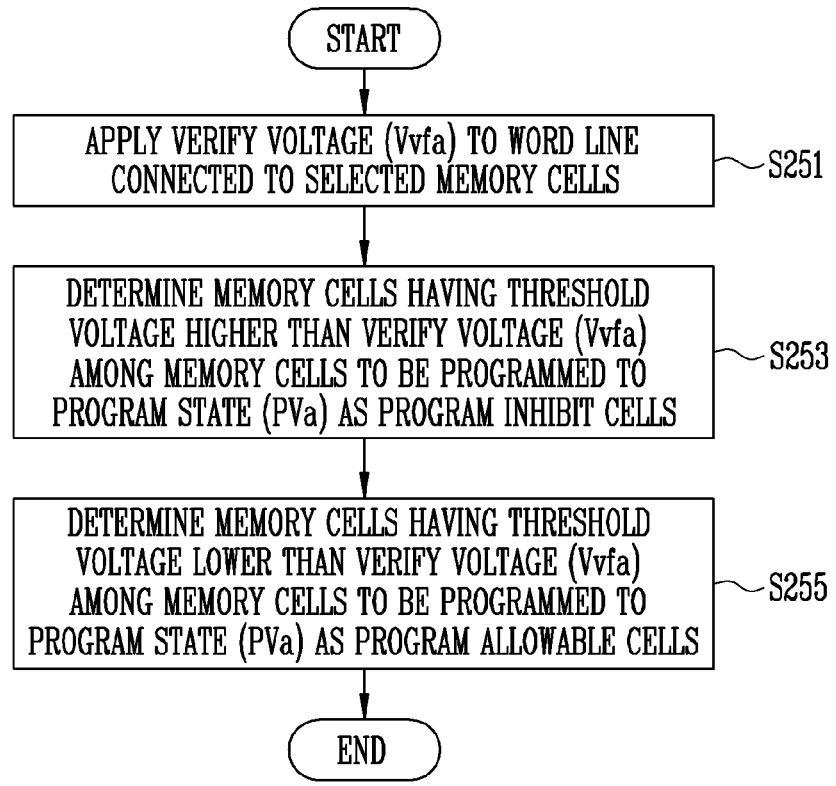
FIG. 12 is a flowchart illustrating an embodiment of step S250 of FIG. 9.

FIG. 12 is a flowchart illustrating an embodiment of step S250 of FIG. 9 in more detail.

Referring to FIG. 12, performing the verify operation on the selected memory cells (S250) includes applying the verify voltage Vvfa to the word line connected to the selected memory cells (S251), determining the memory cells having the threshold voltage higher than the verify voltage Vvfa among the memory cells to be programmed to the program state PVa as the program inhibit cells (S253), and determining the memory cells having the threshold voltage lower than the verify voltage Vvfa among the memory cells to be programmed to the program state PVa as the program allowable cells (S255).

That is, after the program voltage is applied to the word line connected to the selected memory cells (S230), it is determined whether the threshold voltage of the program allowable cells becomes higher than the verify voltage Vvfa. To this end, it is determined whether the threshold voltage of the program allowable cells among the selected memory cells is greater than the verify voltage Vvfa, by applying the verify voltage Vvfa to the selected word line (S251).

In step S253, among the memory cells to be programmed to the program state PVa, the memory cells having the threshold voltage higher than the verify voltage Vvfa are determined as the program inhibit cell. As shown in FIG. 10, the memory cells having the threshold voltage higher than the verify voltage Vvfa are memory cells sufficiently programmed to belong to the program state PVa. Therefore, the memory cells having the threshold voltage higher than the verify voltage Vvfa are determined as the program inhibit cells so as not to increase the threshold voltage in a subsequent program loop.

In step S255, among the memory cells to be programmed to the program state PVa, the memory cells having the threshold voltage lower than the verify voltage Vvfa are determined as the program allowable cell. As shown in FIG. 10, the memory cells having the threshold voltage lower than the verify voltage Vvfa are memory cells that do not yet belong to the program state PVa and memory cells that require an additional program. Therefore, the memory cells having the threshold voltage lower than the verify voltage Vvfa are determined as the program allowable cells to increase the threshold voltage in the subsequent program loop.

Figure 13:
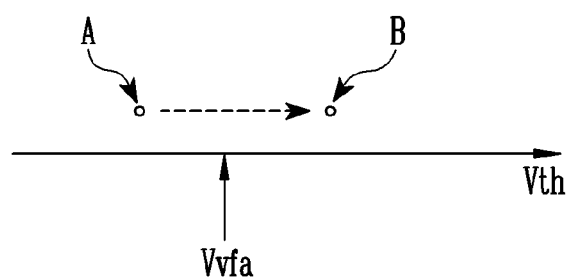
FIG. 13 is a diagram illustrating a threshold voltage of a program allowable cell and a program inhibit cell.

FIG. 13 is a diagram illustrating the threshold voltage of a program allowable cell and a program inhibit cell.

Referring to FIG. 13, a threshold voltage of a memory cell of a position A is lower than the verify voltage Vvfa. Therefore, the memory cell of the position A is the program allowable cell. In a next program loop, the threshold voltage of the program allowable cell may increase, and thus the program allowable cell may move to a position B. The threshold voltage of the memory cell of the position B is higher than the verify voltage Vvfa. Therefore, the memory cell moved to the position B as a result of a program loop is determined as the program inhibit cell, and the threshold voltage does not increase in the next program loop.

According to the embodiment described with reference to FIGS. 10 to 13, even in a case of a memory cell having a threshold voltage that is very slightly lower than the verify voltage Vvfa, the threshold voltage moves at a width similar to that of other program allowable cells. This causes the threshold voltage of the memory cells belonging to the program state PVa to be widely distributed after the program operation. According to another embodiment of the present disclosure, a threshold voltage movement width of a program allowable cell having a threshold voltage near a main verify voltage may be decreased by using a pre-verify voltage and the main verify voltage rather than one verify voltage. Through this, a distribution width of the threshold voltage of the memory cells belonging to the program state PVa may be reduced after the program operation.

Figure 14:
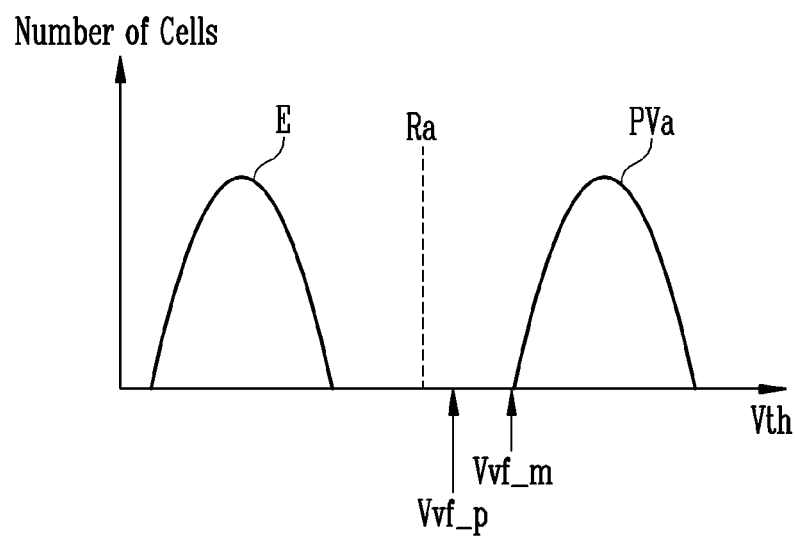
FIG. 14 is a graph illustrating a verify operation using a pre-verify voltage Vvf_p and a main verify voltage Vvf_m according to an embodiment of the present disclosure.

FIG. 14 is a graph illustrating a verify operation using a pre-verify voltage Vvf_p and a main verify voltage Vvf_m according to an embodiment of the present disclosure. According to an embodiment of the present disclosure, the pre-verify voltage Vvf_p and the main verify voltage Vvf_m may be used to determine a threshold voltage state of the memory cells to be programmed to the program state PVa. The main verify voltage Vvf_m of FIG. 14 may be substantially the same as the verify voltage Vvfa of FIG. 10. According to an embodiment of the present disclosure, the threshold voltage distribution of the memory cells may be reduced after the program operation, by additionally using the pre-verify voltage Vvf_p in addition to the main verify voltage Vvf_m.

FIG. 15 is a flowchart illustrating another embodiment of step S250 of FIG. 9 in more detail.

Referring to FIG. 15, performing the verify operation on the selected memory cells (S250) includes applying the pre-verify voltage Vvf_p to the word line connected to the selected memory cells (S311), applying the main verify voltage Vvf_m to the word line connected to the selected memory cells (S313), determining memory cells having a threshold voltage higher than the main verify voltage Vvf_m among the memory cells to be programmed to the program state PVa as the program inhibit cells (S315), determining memory cells having a threshold voltage lower than the pre-verify voltage Vvf_p among the memory cells to be programmed to the program state PVa as a first program allowable cells (S317), and determining memory cells having a threshold voltage lower than the main verify voltage Vvf_m and higher than the pre-verify voltage Vvf_p among the memory cells to be programmed to the program state PVa as a second program allowable cells (S319).

That is, after the program voltage is applied to the word line connected to the selected memory cells (S230), it is determined whether the threshold voltage of the program allowable cells is lower than the pre-verify voltage Vvf_p, the threshold voltage of the program allowable cells is between the pre-verify voltage Vvf_p and the main verify voltage Vvf_m, or the threshold voltage of the program allowable cells is higher than the main verify voltage Vvf_m. To this end, it is determined whether the threshold voltage of the program allowable cells among the selected memory cells is greater than the pre-verify voltage Vvf_p, by applying the pre-verify voltage Vvf_p to the selected word line (S311). In addition, it is determined whether the threshold voltage of the program allowable cells among the selected memory cells is greater than the main verify voltage Vvf_m, by applying the main verify voltage Vvf_m to the selected word line (S313).

In step S315, among the memory cells to be programmed to the program state PVa, the memory cells having the threshold voltage higher than the main verify voltage Vvf_m are determined as the program inhibit cell. As shown in FIG. 14, the memory cells having the threshold voltage higher than the main verify voltage Vvf_m are the memory cells sufficiently programmed to belong to the program state PVa. Therefore, the memory cells having the threshold voltage higher than the main verify voltage Vvf_m are determined as the program inhibit cells so as not to increase the threshold voltage in a subsequent program loop.

In step S317, among the memory cells to be programmed to the program state PVa, the memory cells having the threshold voltage lower than the pre-verify voltage Vvf_p are determined as the first program allowable cells. As shown in FIG. 14, the memory cells having the threshold voltage lower than the pre-verify voltage Vvf_p are the memory cells that do not yet belong to the program state PVa and are the memory cells that require an additional program. Therefore, the memory cells having the threshold voltage lower than the pre-verify voltage Vvf_p are determined as the first program allowable cells to increase the threshold voltage in the subsequent program loop.

Meanwhile, in step S319, among the memory cells to be programmed to the program state PVa, the memory cells having the threshold voltage lower than the main verify voltage Vvf_m and higher than the pre-verify voltage Vvf_p are determined as the second program allowable cells. As shown in FIG. 14, the memory cells having the threshold voltage lower than the main verify voltage Vvf_m and higher than the pre-verify voltage Vvf_p are also memory cells that do not yet belong to the program state PVa and memory cells that require an additional program. Therefore, the memory cells having the threshold voltage lower than the main verify voltage Vvf_m and higher than the pre-verify voltage Vvf_p are determined as the second program allowable cells to increase the threshold voltage in the subsequent program loop.

Referring to FIG. 14 together, the first program allowable cells are the memory cells having the threshold voltage lower than the pre verify voltage Vvf_p, and the second program allowable cells are the memory cells having the threshold voltage between the pre verify voltage Vvf_p and the main verify voltage Vvf_m. That is, the second program allowable cells are memory cells having a threshold voltage closer to the main verify voltage Vvf_m than the first program allowable cell. Therefore, in accordance with the semiconductor memory device and the method of operating the same according to an embodiment of the present disclosure, a threshold voltage movement width of the second program allowable cells is controlled to be less than a threshold voltage movement width of the first program allowable cells in a subsequent program loop. To this end, a voltage applied to a bit line connected to the first program allowable cells and a voltage applied to a bit line connected to the second program allowable cells are applied differently. Hereinafter, the present disclosure is described with reference to FIG. 16.

FIG. 16 is a flowchart illustrating another embodiment of step S210 of FIG. 9 in more detail. FIG. 17 is a diagram illustrating the threshold voltage of the first program allowable cells, the second program allowable cells, and the program inhibit cells. Hereinafter, setting the state of the bit line connected to the selected memory cells is described with reference to FIGS. 16 and 17 together.

Referring to FIG. 16, step S210 may include applying a first program allowable voltage to the bit line connected to the first program allowable cells (S331), applying a second program allowable voltage to the bit line connected to the second program allowable cells (S333), and applying the program inhibit voltage to the bit line connected to the program inhibit cells (S335). In an embodiment, the program inhibit voltage may be greater than the second program allowable voltage, and the second program allowable voltage may be greater than the first program allowable voltage. For example, the first program allowable voltage may be a ground voltage.

Because the first program allowable voltage and the second program allowable voltage are different from each other, when the program voltage is applied to the selected word line (S230), the threshold voltage movement width of the first program allowable cells and the second program allowable cells may be different. More specifically, because the second program allowable voltage is greater than the first program allowable voltage, the threshold voltage movement width of the first program allowable cells is greater than the threshold voltage movement width of the second program allowable cells.

Referring to FIG. 17, a threshold voltage of a memory cell of a position C is lower than the pre-verify voltage Vvf_p. Therefore, the memory cell of the position C is the first program allowable cell. In addition, a threshold voltage of a memory cell of a position E is higher than the pre-verify voltage Vvf_p and lower than the main verify voltage Vvf_m. Therefore, the memory cell of the position E is the second program allowable cell.

As described above, the first program allowable voltage applied to the bit line connected to the first program allowable cell is less than the second program allowable voltage applied to the bit line connected to the second program allowable cell. Therefore, the threshold voltage movement width of the first program allowable cell is greater than the threshold voltage movement width of the second program allowable cell. As shown in FIG. 17, the first program allowable cell of the position C moves to a position D and thus becomes a program inhibit cell, and the second program allowable cell of the position E moves to a position F and thus becomes a program inhibit cell. Because the threshold voltage movement width of the second program allowable cell of the position E is less than the threshold voltage movement width of the first program allowable cell of the position C, a threshold voltage distribution difference of the program inhibit cells of the position D and the position F becomes small. As a result, the threshold voltage distribution width of the memory cells on which the program is completed becomes narrow.

Figure 18:
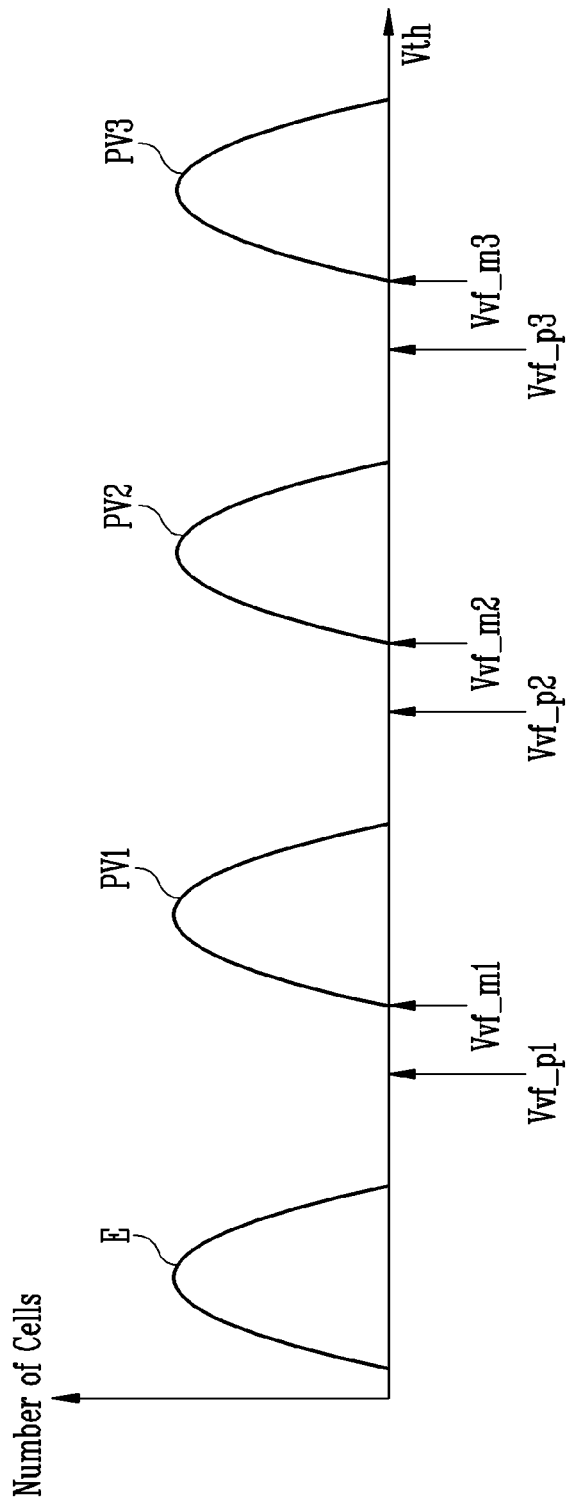
FIG. 18 is a graph illustrating a threshold voltage distribution after a program operation of a multi-level cell (MLC).

FIG. 18 is a graph illustrating a threshold voltage distribution after the program operation of the MLC.

Referring to FIG. 18, the MLC in which two bits are stored per one memory cell belongs to any one of an erase state E, a first program state PV1, a second program state PV2, and a third program state PV3 after the program operation. According to an embodiment of the present disclosure, a pre-verify voltage and a main verify voltage are used during a verify operation corresponding to each of the first to third program states PV1 to PV3.

For example, according to an embodiment of the present disclosure, during the verify operation corresponding to the first program state PV1, a first pre-verify voltage Vvf_p1 and a first main verify voltage Vvf_m1 corresponding to the first program state PV1 are used. In addition, during the verify operation corresponding to the second program state PV2, a second pre-verify voltage Vvf_p2 and a second main verify voltage Vvf_m2 corresponding to the second program state PV2 are used. Finally, during the verify operation corresponding to the third program state PV3, a third pre-verify voltage Vvf_p3 and a third main verify voltage Vvf_m3 corresponding to the third program state PV3 are used.

Similarly, also in the program operation of the TLC, the verify operation may be performed using the pre-verify voltage and the main verify voltage for each program state.

Figure 19:
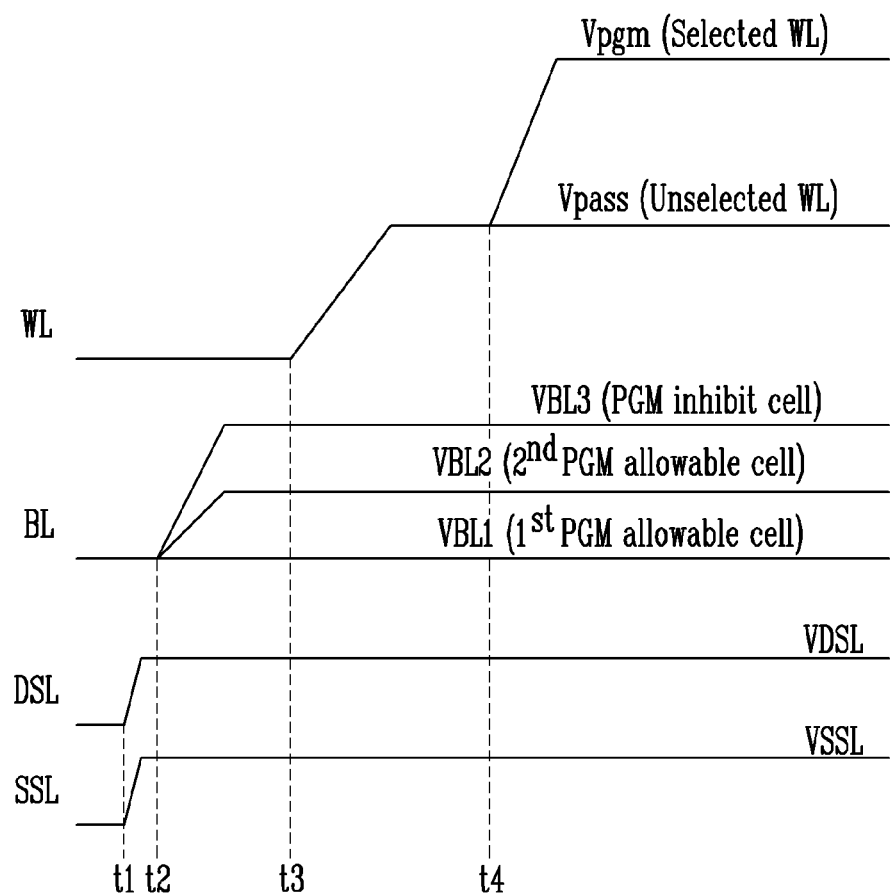
FIG. 19 is a timing diagram illustrating a program operation according to an embodiment of the present disclosure.

FIG. 19 is a timing diagram illustrating a program operation according to an embodiment of the present disclosure. More specifically, among the program phase and the verify phase of each program loop shown in FIG. 7, a timing diagram corresponding to the program phase is shown in FIG. 19. Referring to FIG. 19, voltages of the word line WL, the bit line BL, the drain select line DSL, and the source select line SSL connected to the selected memory block in the program phase are shown. Hereinafter, the present disclosure is described with reference to FIGS. 9 and 19 together.

Referring to FIG. 19, at a time t1, a voltage VDSL is applied to the drain select line DSL and a voltage VSSL is applied to the source select line SSL (S200). Thereafter, at a time t2, a bit line voltage is applied to the bit lines connected to the selected memory block (S210). More specifically, a first bit line voltage VBL1 is applied to bit lines connected to the memory cells determined as the first program allowable cells in the previous verify phase among the bit lines. Meanwhile, a second bit line voltage VBL2 is applied to bit lines connected to the memory cells determined as the second program allowable cells in the previous verify phase among the bit lines. The second bit line voltage VBL2 may be greater than the first bit line voltage VBL1. In addition, a third bit line voltage VBL3 is applied to bit lines connected to the memory cells determined as the program inhibit cells in the previous verify phase among the bit lines. The third bit line voltage VBL3 may be a voltage greater than the second bit line voltage VBL2 and may be the program inhibit voltage.

Thereafter, at a time t3, the pass voltage Vpass may be applied to the word lines connected to the selected memory block. Thereafter, at a time t4, the program voltage Vpgm may be applied to the selected word line, which is the word line connected to the memory cells to be programmed, among the word lines. Through this process, the threshold voltages of the first and second program allowable cells among the selected memory cells may increase. At this time, a threshold voltage increase width of the first program allowable cells may be greater than a threshold voltage increase width of the second program allowable cells.

According to an embodiment of the present disclosure, the voltage VDSL applied to the drain select line DSL and the voltage VSSL applied to the source select line SSL may be maintained constant during the program phase while the program operation is started and the program loop is repeatedly performed. In order to improve a threshold voltage distribution characteristic of the memory cells in the program operation, the second bit line voltage VBL2 is required to be increased, and the voltage VDSL of the drain select line DSL is also increased. In this case, disturbance may occur due to a leakage current of the drain select line DSL in a program inhibit string. Therefore, a program method capable of reducing disturbance while improving the threshold voltage distribution characteristic of the memory cells is required.

According to another embodiment of the present disclosure, when program verify of memory cells for a specific program state among a plurality of program states is completed, a voltage applied to the select line may be decreased in the program phase of the subsequent program loop. Taking the MLC shown in FIG. 18 as an example, a program state in which a distribution is important is the first and second program states PV1 and PV2 between the erase state E and the third program state PV3. In addition, a region in which the disturbance most occurs during the program operation is the third program state PV3 to which a relatively high program voltage is applied. When target cells are programmed to the third program state PV3, an electric field of the word line becomes large compared to a low channel potential, and thus a possibility of occurrence of disturbance increases. Accordingly, an operation method before the program verify for the first and second program states PV1 and PV2 is completed and an operation method after the program verify for the first and second program states PV1 and PV2 is completed may be differently applied. For example, in the program operation of the MLC, a relatively large voltage may be applied to the select line before the program of the memory cells to be programmed to the second program state PV2 is completed, and a relatively small voltage may be applied to the select line after the program of the memory cells to be programmed to the second program state PV2 is completed.

Through this, a relatively high select line voltage may be applied during the program operation of the memory cells to be programmed to the first and second program states PV1 and PV2 to improve the threshold voltage distribution of the first and second program states PV1 and PV2. In addition, after the program of the memory cells to be programmed to the first and second program states PV1 and PV2 is completed, a relatively low select line voltage may be applied to reduce program disturbance by alleviating the occurrence of leakage current in the select transistor.

FIG. 20 is a flowchart illustrating an embodiment of step S200 of FIG. 9 in more detail.

Referring to FIG. 20, setting the state of the select line connected to the select transistor included in the selected memory block (S200) may include checking program states of which program is completed in the verify phase of the immediately previous program loop (S201), to determine if a program of memory cells, whose target program state is the i-th program state, is completed, applying a first voltage to the select line connected to the select transistor (S205), when the program of the memory cells to be programmed to the i-th program state is not completed (S203: No). Meanwhile, setting the state of the select line connected to the select transistor included in the selected memory block (S200) may include applying a second voltage less than the first voltage to the select line connected to the select transistor (S207), when the program of the memory cells to be programmed to the i-th program state is completed (S203: Yes).

The i-th program state may be appropriately selected according to need. For example, in a case of the program operation of the MLC, the i-th program state may be selected as the second program state PV2. In this case, in step S201, the program states of which verification is completed in the verify phase of the immediately previous program loop are checked. More specifically, it is checked whether the verification of the memory cells to be programmed to the second program state PV2 has been passed. As a result of the check, when the program of the memory cells, whose target program state is the second program state PV2, is not completed (S203: No), the first voltage is applied to the select line connected to the select transistor (S205). Accordingly, in the program loops at the initial stage of the program operation, the first voltage may be applied to the select line connected to the select transistor.

Conversely, when the program of the memory cells to be programmed to the second program state PV2 is completed (S203: Yes), this means that the memory cells for which the program is not yet completed are the memory cells to be programmed to the third program state PV3. Therefore, a second voltage less than the first voltage is applied to the select line connected to the select transistor in order to reduce the leakage current occurrence in the select transistor (S207).

In the above, a case where the i-th program state is the second program state in the program operation of the MLC is described, but the present disclosure is not limited thereto. In another embodiment, in the program operation of the MLC, the i-th program state may be the first program state.

In addition, in the program operation of the TLC, the i-th program state may be a sixth program state. However, the present disclosure is not limited thereto, and in the program operation of the TLC, the i-th program state may be any one of first to fifth program states.

Meanwhile, the select transistor of steps S205 and S207 may be any one of the drain select transistor or the source select transistor. When the select transistor of steps S205 and S207 is the drain select transistor, the select line may be the drain select line. When the select transistor of steps S205 and S207 is the source select transistor, the select line may be the source select line.

Figure 21A:
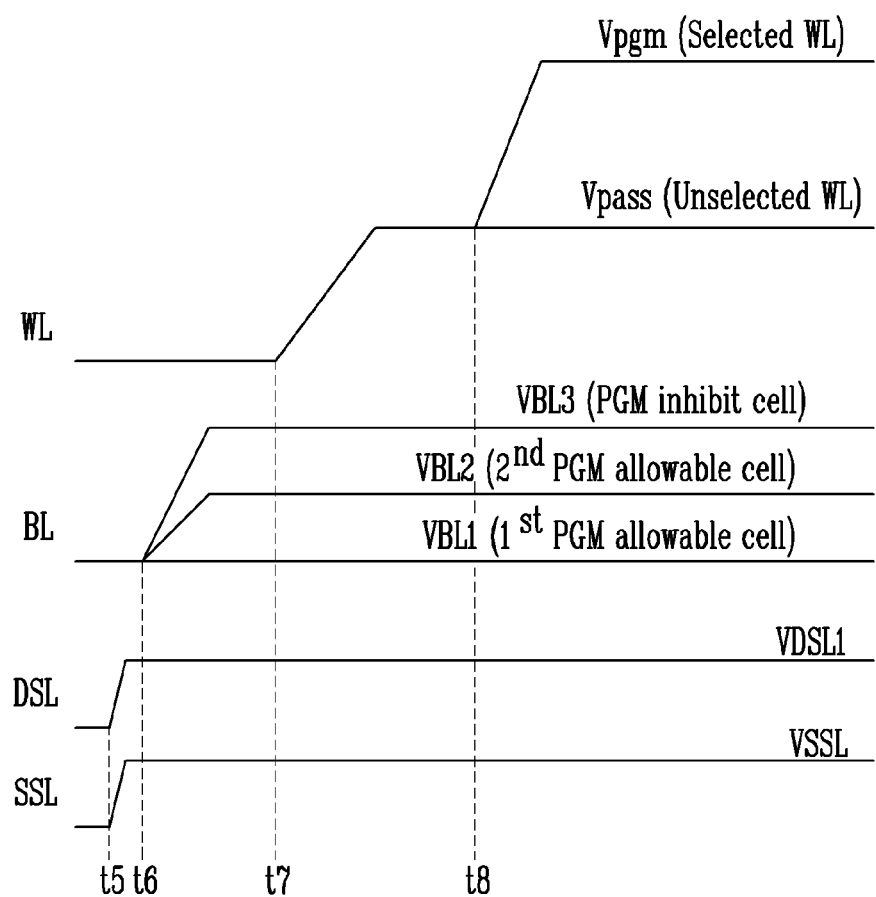
FIG. 21A is a timing diagram illustrating an operation of a semiconductor memory device according to an embodiment when a program of memory cells to be programmed to an i-th program state is not completed.
Figure 21B:
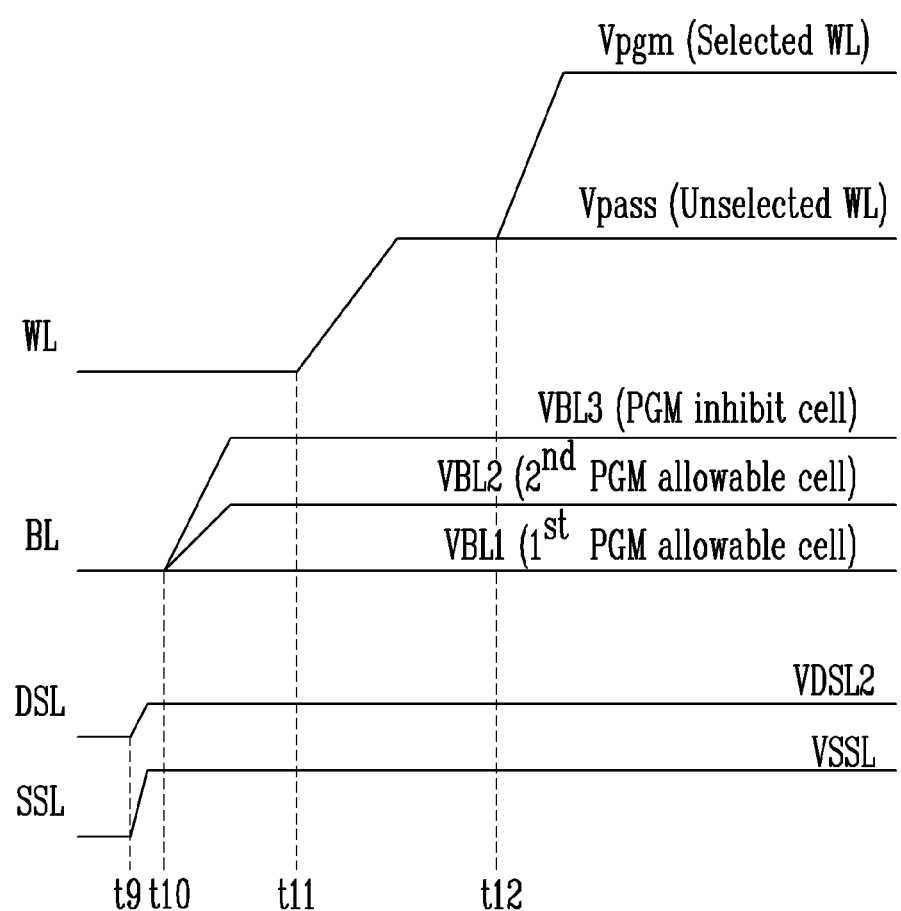
FIG. 21B is a timing diagram illustrating an operation of a semiconductor memory device according to an embodiment when the program of the memory cells to be programmed to the i-th program state is completed.

FIG. 21A is a timing diagram illustrating an operation of a semiconductor memory device according to an embodiment when the program of the memory cells to be programmed to the i-th program state is not completed. FIG. 21B is a timing diagram illustrating an operation of a semiconductor memory device according to an embodiment when the program of the memory cells to be programmed to the i-th program state is completed.

Referring to FIG. 21A, because the program of the memory cells to be programmed to the i-th program state is not completed (S203: No), at a time t5, a first voltage VDSL1 is applied to the drain select line DSL (S205), the voltage VSSL is applied to the source select line SSL. Thereafter, at a time t6, the bit line voltage is applied to the bit lines connected to the selected memory block (S210). More specifically, the first bit line voltage VBL1 is applied to the bit lines connected to the memory cells determined as the first program allowable cells in the previous verify phase among the bit lines. Meanwhile, the second bit line voltage VBL2 is applied to the bit lines connected to the memory cells determined as the second program allowable cells in the previous verify phase among the bit lines. The second bit line voltage VBL2 may be greater than the first bit line voltage VBL1. In addition, the third bit line voltage VBL3 is applied to the bit lines connected to the memory cells determined as the program inhibit cells in the previous verify phase among the bit lines. The third bit line voltage VBL3 may be the voltage greater than the second bit line voltage VBL2 and may be the program inhibit voltage.

Thereafter, at a time t7, the pass voltage Vpass may be applied to the word lines connected to the selected memory block. Thereafter, at a time t8, the program voltage Vpgm may be applied to the selected word line that is the word line connected to memory cells to be programmed among the word lines.

Referring to FIG. 21B, because the program of the memory cells to be programmed to the i-th program state is completed (S203: Yes), at a time t9, a second voltage VDSL2 is applied to the drain select line DSL, and the voltage VSSL is applied to the source select line SSL. The second voltage VDSL2 of FIG. 21B is less than the first voltage VDSL1 of FIG. 21A. Thereafter, at a time t10, the bit line voltage is applied to the bit lines connected to the selected memory block. Thereafter, at a time t11, the pass voltage Vpass may be applied to the word lines connected to the selected memory block. Thereafter, at a time t12, the program voltage Vpgm may be applied to the selected word line that is the word line connected to the memory cells to be programmed among the word lines.

FIGS. 21A and 21B show an embodiment in which the first voltage VDSL1 is applied to the drain select line DSL when the program of the memory cells to be programmed to the i-th program state is not completed (S203: No) and the second voltage VDSL2 less than the first voltage VDSL1 is applied to the drain select line DSL when the program of the memory cells to be programmed to the i-th program state is completed (S203: Yes). However, the present disclosure is not limited thereto, and the voltage of the source select line may be adjusted as shown in FIGS. 23A and 23B.

Figure 22:
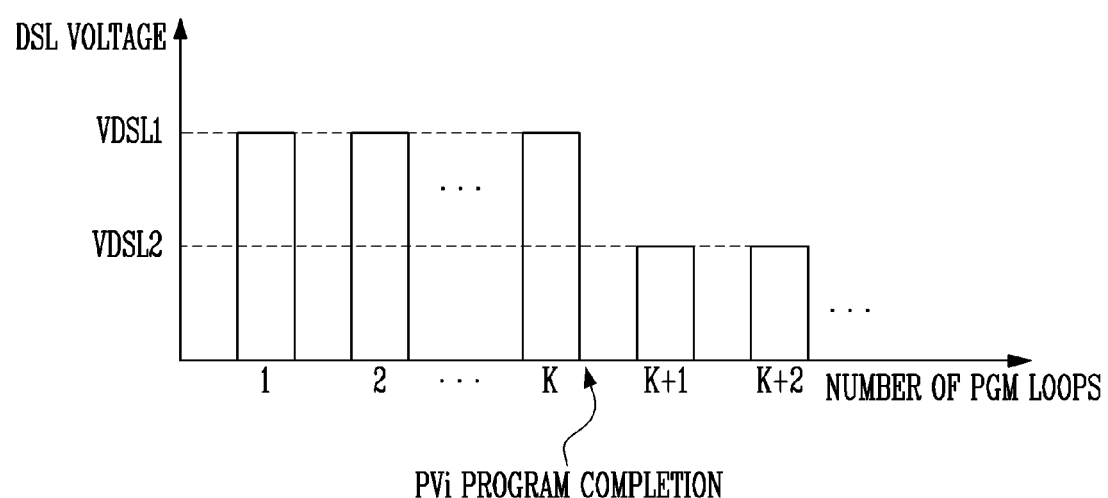
FIG. 22 is a graph illustrating a method of operating a semiconductor memory device according to an embodiment of the present disclosure described with reference to FIGS. 21A and 21B in another aspect.

FIG. 22 is a graph illustrating a method of operating a semiconductor memory device according to an embodiment of the present disclosure described with reference to FIGS. 21A and 21B in another aspect. Referring to FIG. 22, as the program loop is repeated, a size of a DSL voltage applied to the drain select line in the program phase is shown. The first voltage VDSL1 may be applied to the drain select line DSL at the initial stage of the program operation, that is, in first to K-th program loops before the program of the memory cells corresponding to the i-th program state PVi is completed. In FIG. 22, an embodiment in which the program of the memory cells corresponding to the i-th program state PVi is completed as the K-th program loop is performed is shown. Accordingly, the second voltage VDSL2 less than the first voltage VDSL1 may be applied to the drain select line DSL in a (K+1)-th program loop and a program loop subsequent thereto.

Figure 23A:
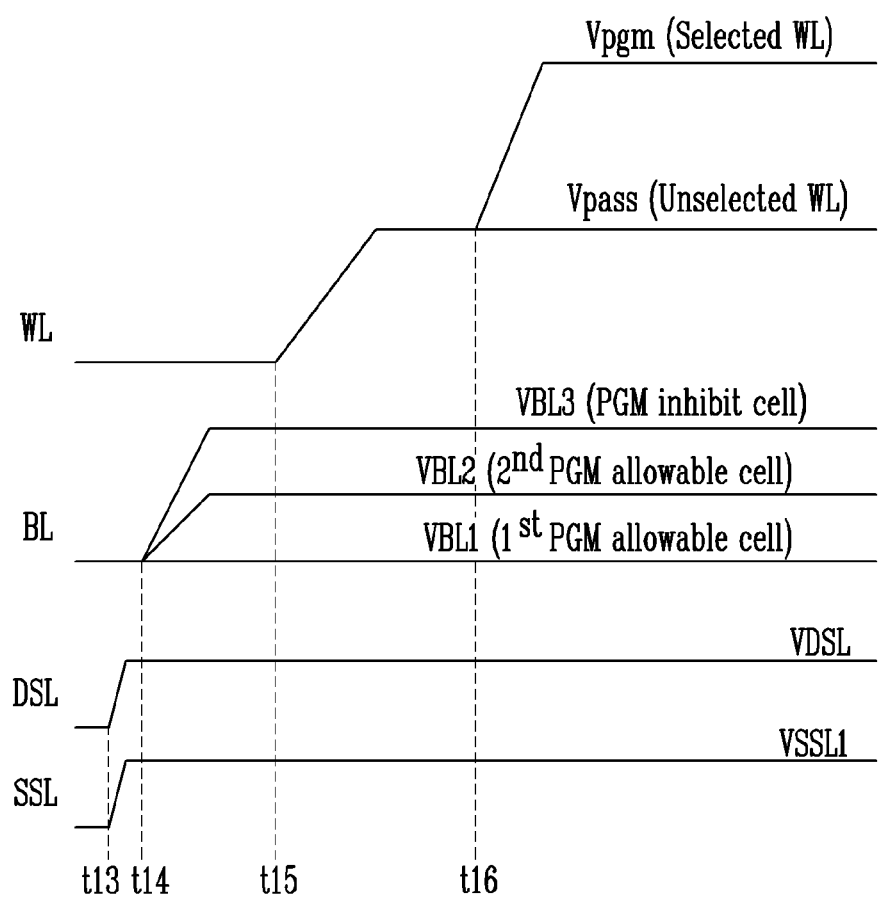
FIG. 23A is a timing diagram illustrating an operation of a semiconductor memory device according to another embodiment when the program of the memory cells to be programmed to the i-th program state is not completed.
Figure 23B:
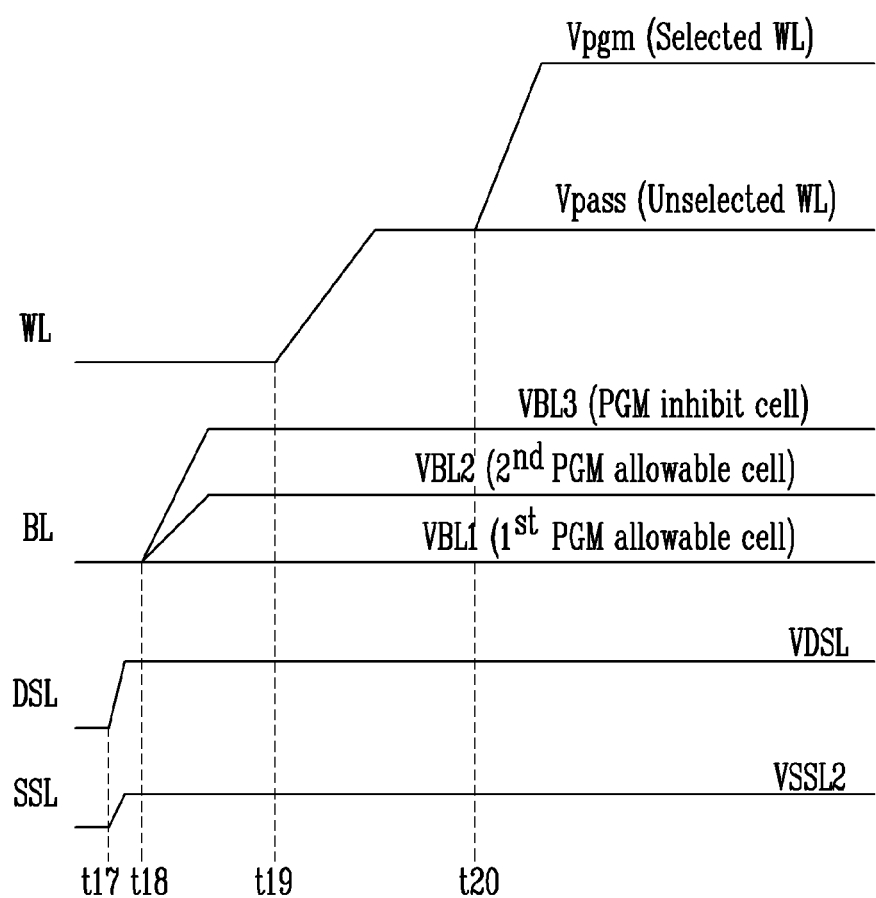
FIG. 23B is a timing diagram illustrating an operation of a semiconductor memory device according to another embodiment when the program of the memory cells to be programmed to the i-th program state is completed.

FIG. 23A is a timing diagram illustrating an operation of a semiconductor memory device according to another embodiment when the program of the memory cells to be programmed to the i-th program state is not completed. FIG. 23B is a timing diagram illustrating an operation of a semiconductor memory device according to another embodiment when the program of the memory cells to be programmed to the i-th program state is completed.

Referring to FIG. 23A, because the program of the memory cells to be programmed to the i-th program state is not completed (S203: No), at a time t13, a first voltage VSSL1 is applied to the source select line SSL (S205), the voltage VDSL is applied to the drain select line DSL. Thereafter, at a time t14, the bit line voltage is applied to the bit lines connected to the selected memory block (S210). More specifically, the first bit line voltage VBL1 is applied to the bit lines connected to the memory cells determined as the first program allowable cells in the previous verify phase among the bit lines. Meanwhile, the second bit line voltage VBL2 is applied to the bit lines connected to the memory cells determined as the second program allowable cells in the previous verify phase among the bit lines. The second bit line voltage VBL2 may be greater than the first bit line voltage VBL1. In addition, the third bit line voltage VBL3 is applied to the bit lines connected to the memory cells determined as the program inhibit cells in the previous verify phase among the bit lines. The third bit line voltage VBL3 may be the voltage greater than the second bit line voltage VBL2 and may be the program inhibit voltage.

Thereafter, at a time t15, the pass voltage Vpass may be applied to the word lines connected to the selected memory block. Thereafter, at a time t16, the program voltage Vpgm may be applied to the selected word line that is the word line connected to memory cells to be programmed among the word lines.

Referring to FIG. 23B, because the program of the memory cells to be programmed to the i-th program state is completed (S203: Yes), at a time t17, a second voltage VSSL2 is applied to the source select line SSL, and the voltage VDSL is applied to the drain select line DSL. The second voltage VSSL2 of FIG. 23B is less than the first voltage VSSL1 of FIG. 23A. Thereafter, at a time t18, the bit line voltage is applied to the bit lines connected to the selected memory block. Thereafter, at a time t19, the pass voltage Vpass may be applied to the word lines connected to the selected memory block. Thereafter, at a time t20, the program voltage Vpgm may be applied to the selected word line that is the word line connected to the memory cells to be programmed among the word lines.

In the embodiment of FIGS. 23A and 23B, an embodiment in which the first voltage VSSL1 is applied to the source select line SSL when the program of the memory cells to be programmed to the i-th program state is not completed (S203: No) and the second voltage VSSL2 less than the first voltage VSSL1 is applied to the source select line SSL when the program of the memory cells to be programmed to the i-th program state is completed (S203: Yes) is shown. However, the present disclosure is not limited thereto, and the voltage of the drain select line may be adjusted as shown in FIGS. 21A and 21B.

Figure 24:
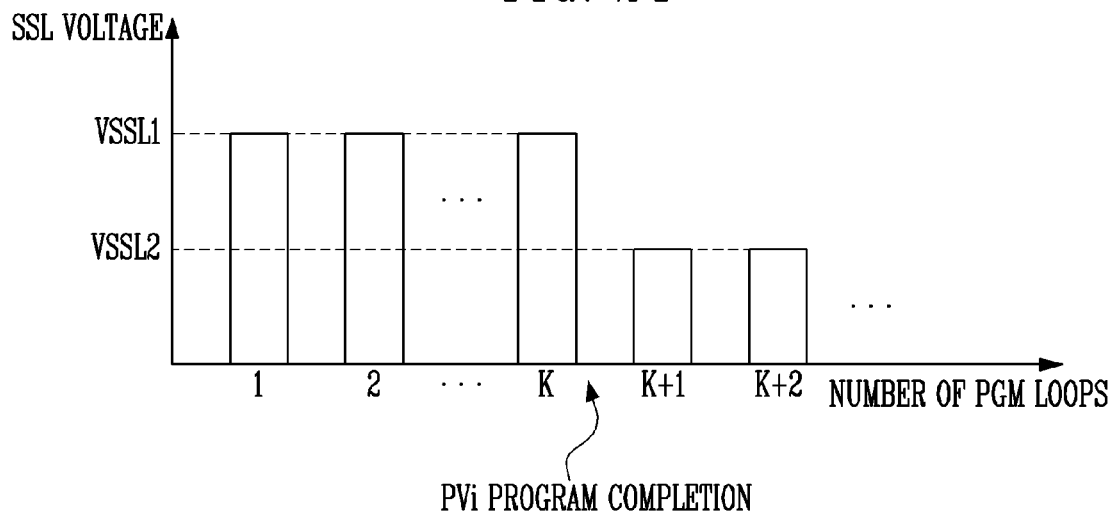
FIG. 24 is a graph illustrating a method of operating a semiconductor memory device according to an embodiment of the present disclosure described with reference to FIGS. 23A and 23B in another aspect.

FIG. 24 is a graph illustrating a method of operating a semiconductor memory device according to an embodiment of the present disclosure described with reference to FIGS. 23A and 23B in another aspect. Referring to FIG. 24, as the program loop is repeated, a size of an SSL voltage applied to the source select line in the program phase is shown. The first voltage VSSL1 may be applied to the source select line SSL at the initial stage of the program operation, that is, in the first to K-th program loops before the program of the memory cells corresponding to the i-th program state PVi is completed. In FIG. 24, an embodiment in which the program of the memory cells corresponding to the i-th program state PVi is completed as the K-th program loop is performed is shown. Accordingly, the second voltage VSSL2 less than the first voltage VSSL1 may be applied to the source select line SSL in the (K+1)-th program loop and the program loop subsequent thereto.

Figure 25:
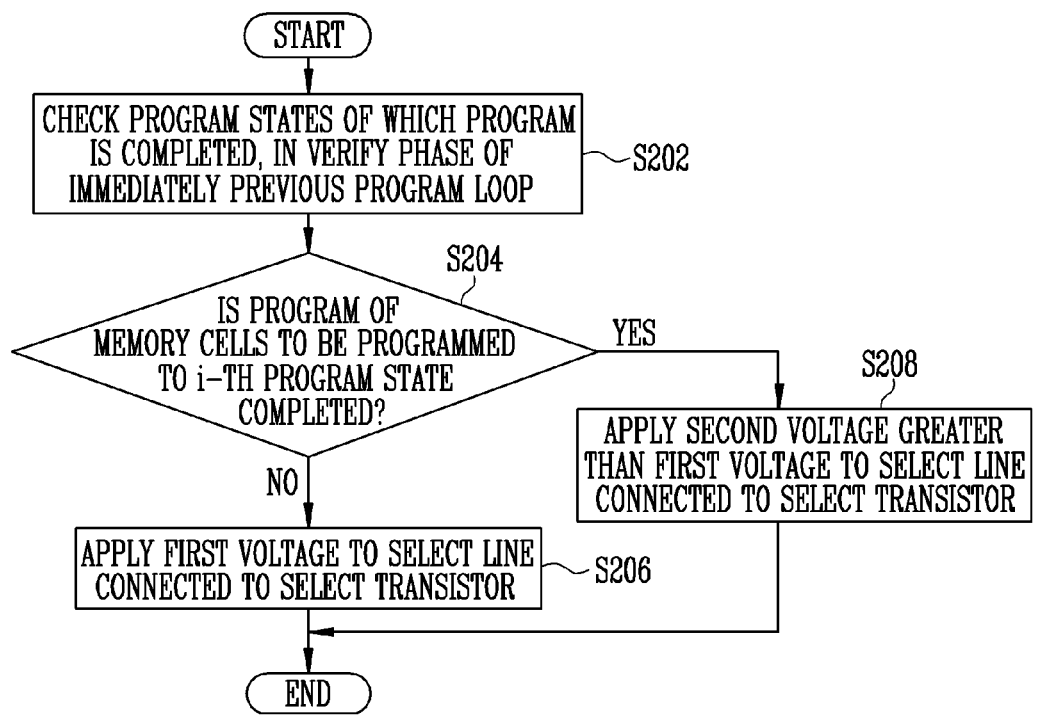
FIG. 25 is a flowchart illustrating another embodiment of step S200 of FIG. 9.

FIG. 25 is a flowchart illustrating another embodiment of step S200 of FIG. 9.

Referring to FIG. 25, setting the state of the select line connected to the select transistor included in the selected memory block (S200) may include checking program states of which the program is completed in the verify phase of the immediately previous program loop (S202), applying a first voltage to the select line connected to the select transistor (S206), when the program of the memory cells to be programmed to the i-th program state is not completed (S204: No). Meanwhile, setting the state of the select line connected to the select transistor included in the selected memory block (S200) may include applying a second voltage greater than the first voltage to the select line connected to the select transistor (S208), when the program of the memory cells to be programmed to the i-th program state is completed (S204: Yes).

Referring to the embodiment shown in FIG. 20, when the program of the memory cells to be programmed to the i-th program state is not completed (S203: No), the first voltage is applied to the select line connected to the select transistor (S205), and when the program of the memory cells to be programmed to the i-th program state is completed (S203: Yes), the second voltage less than the first voltage is applied to the select line connected to the select transistor (S207).

Meanwhile, referring to the embodiment shown in FIG. 25, when the program of the memory cells to be programmed to the i-th program state is not completed (S204: No), the first voltage is applied to the select line connected to the select transistor (S206), and when the program of the memory cells to be programmed to the i-th program state is completed (S204: Yes), the second voltage greater than the first voltage is applied to the select line connected to the select transistor (S208). That is, according to the embodiment shown in FIG. 25, in the initial program loops of the program operation, a relatively small first voltage may be applied to the select line connected to the select transistor, and after the program of the memory cells corresponding to the i-th program state is completed, a relatively large second voltage may be applied to the select line connected to the select transistor.

Figure 26:
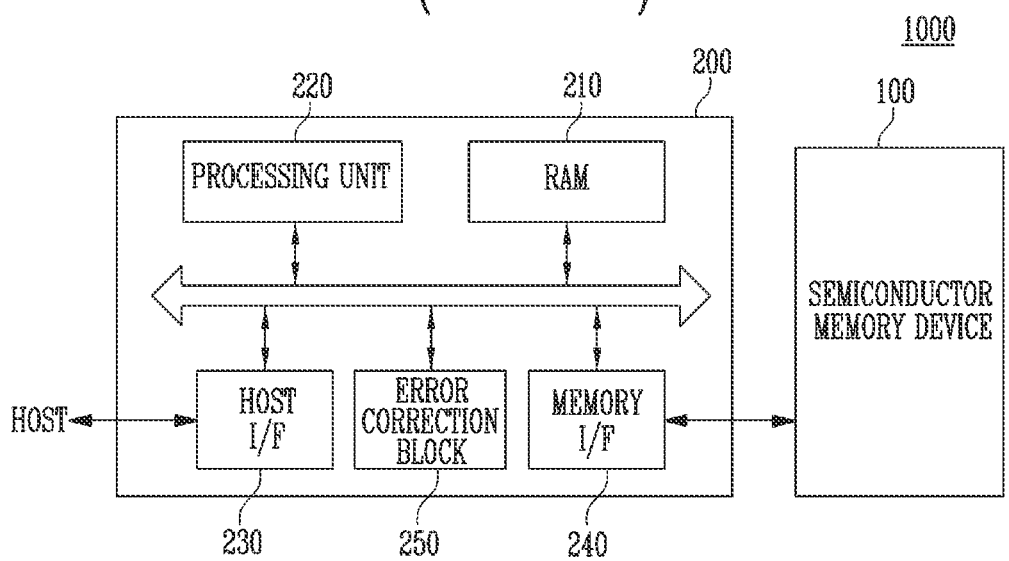
FIG. 26 is a block diagram illustrating an example of the controller shown in FIG. 1.

FIG. 26 is a block diagram illustrating an example of the controller 200 shown in FIG. 1.

Referring to FIG. 26, the controller 200 is connected to the semiconductor memory device 100 and a host HOST. The semiconductor memory device 100 may be the semiconductor memory device described with reference to FIG. 2.

The controller 200 is configured to access the semiconductor memory device 100 in response to a request from the host Host. For example, the controller 200 is configured to control read, write, erase, and background operations of the semiconductor memory device 100. The controller 200 is configured to provide an interface between the semiconductor memory device 100 and the host Host. The controller 200 is configured to drive firmware for controlling the semiconductor memory device 100.

The controller 200 includes random access memory (RAM) 210, a processing unit 220, a host interface 230, a memory interface 240, and an error correction block 250. The RAM 210 is used as at least one of operation memory of the processing unit 220, cache memory between the semiconductor memory device 100 and the host Host, and buffer memory between the semiconductor memory device 100 and the host Host.

The processing unit 220 controls an overall operation of the controller 200.

The host interface 230 includes a protocol for performing data exchange between the host Host and the controller 200. In an embodiment, the controller 200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 240 interfaces with the semiconductor memory device 100. For example, the memory interface 1240 includes a NAND interface or a NOR interface. The memory interface 240 of FIG. 10 may be substantially the same component as the memory interface 207 of FIG. 7.

The error correction block 250 is configured to detect and correct an error of data received from the semiconductor memory device 100 using an error correcting code (ECC). The processing unit 220 may control the semiconductor memory device 100 to adjust a read voltage and perform re-read according to an error detection result of the error correction block 250.

The controller 200 and the semiconductor memory device 100 may be integrated into one semiconductor device. In an embodiment, the controller 200 and the semiconductor memory device 100 may be integrated into one semiconductor device to form a memory card. For example, the controller 200 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) includes the memory system 1000 configured to store data in a semiconductor memory. When the memory system 1000 including the controller 200 and the semiconductor memory device 100 is used as the semiconductor drive (SSD), an operation speed of the host connected to the memory system 1000 is dramatically improved.

As another example, the memory system 1000 including the controller 200 and the semiconductor memory device 100 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 and the memory system including the same may be mounted as a package of various types. For example, the semiconductor memory device 100 or the memory system may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 27:
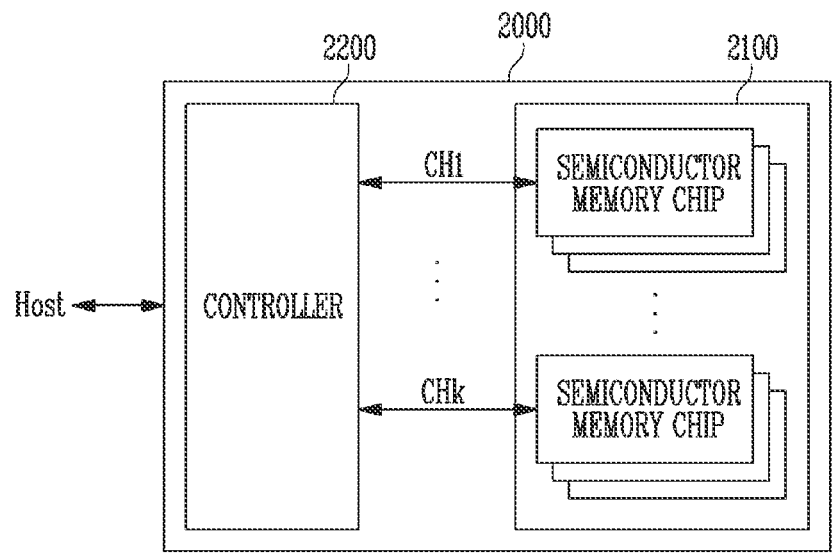
FIG. 27 is a block diagram illustrating an application example of a memory system of FIG. 26.

FIG. 27 is a block diagram illustrating an application example of the memory system 1000 of FIG. 26.

Referring to FIG. 27, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 27, the plurality of groups communicate with the controller 2200 through first to k-th channels CH1 to CHk, respectively. Each semiconductor memory chip is configured and is operated similarly to that of the semiconductor memory device 100 described with reference to FIG. 2.

Each group is configured to communicate with the controller 2200 through one common channel. The controller 2200 is configured similarly to the controller 200 described with reference to FIG. 26 and is configured to control the plurality of memory chips of the semiconductor memory device 2100 through the plurality of channels CH1 to CHk.

Figure 28:
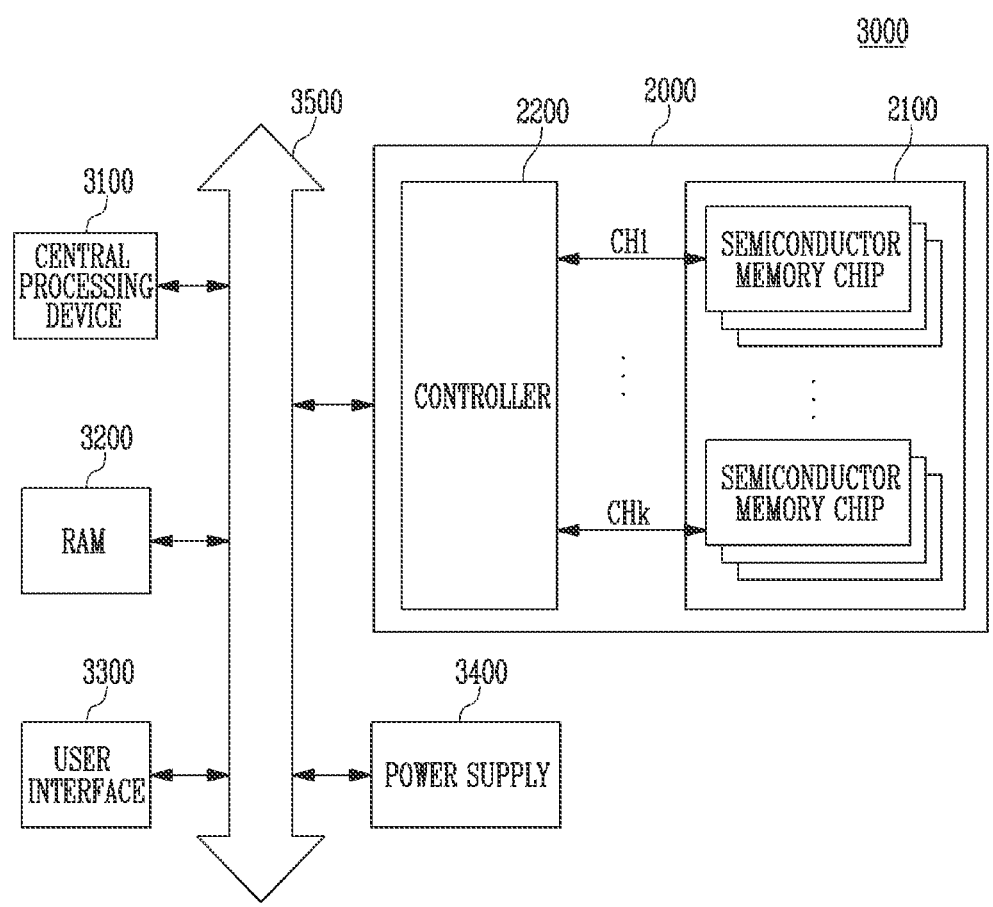
FIG. 28 is a block diagram illustrating a computing system including the memory system described with reference to FIG. 27.

FIG. 28 is a block diagram illustrating a computing system 3000 including the memory system 2000 described with reference to FIG. 27.

The computing system 3000 includes a central processing device 3100, random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 28, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 28, the memory system 2000 described with reference to FIG. 27 is provided. However, the memory system 2000 may be replaced with the memory system 1000 including the controller 200 and the semiconductor memory device 100 described with reference to FIG. 26.

The embodiments of the present disclosure disclosed in the present specification and drawings are merely provided with specific examples to describe the technical content of the present disclosure and to help in understanding the present disclosure, and are not intended to limit the scope of the present disclosure. Those of ordinary skill in the art will appreciate that other modified examples based on the technical spirit of the present disclosure may be implemented in addition to the embodiments disclosed herein.

What is claimed is:

1. A method of operating a semiconductor memory device for programming selected memory cells among a plurality of memory cells, the method comprising performing a plurality of program loops with each of the plurality of program loops including a program phase and a verify phase, wherein the program phase comprises:
applying a first voltage or a second voltage to a select line coupled to a selected memory block including the selected memory cells based on a number of times the plurality of program loops is performed;
setting a state of a bit line coupled to the selected memory block;
applying a program voltage to a selected word line among word lines coupled to the selected memory block while the first voltage or the second voltage is applied to the select line; and
applying a pass voltage to an unselected word line among the word lines coupled to the selected memory block.

2. The method of claim 1, wherein applying the first voltage or the second voltage to the select line comprises:
checking program states of which a program is completed in the verify phase of an immediately previous program loop; and
applying the first voltage to the select line, when a program of memory cells to be programmed to an i-th program state is not completed among first to $(2^N-1)$-th program states,
wherein each of the plurality of memory cells is capable of storing N bits of data, N is a natural number greater than 1, and i is a natural number greater than 0 and less than $(2^N-1)$.

3. The method of claim 2, wherein applying the first voltage or the second voltage to the select line comprises applying the second voltage different from the first voltage to the select line, when the program of the memory cells to be programmed to the i-th program state is completed.

4. The method of claim 3, wherein the select line is a drain select line.

5. The method of claim 3, wherein the select line is a source select line.

6. The method of claim 3, wherein the second voltage is less than the first voltage.

7. The method of claim 3, wherein the second voltage is greater than the first voltage.

8. The method of claim 2, wherein N is 2 and i is 2.

9. The method of claim 2, wherein N is 3 and i is 6.

10. The method of claim 1, wherein the verify phase comprises:
applying a pre-verify voltage to a word line coupled to the selected memory cells; and
applying a main verify voltage greater than the pre-verify voltage to the word line coupled to the selected memory cells.

11. The method of claim 10, wherein the verify phase further comprises determining memory cells having a threshold voltage higher than the main verify voltage as program inhibit cells.

12. The method of claim 11, wherein the verify phase further comprises:
determining memory cells having a threshold voltage lower than the pre-verify voltage as first program allowable cells; and
determining memory cells having a threshold voltage higher than the pre-verify voltage and lower than the main verify voltage as second program allowable cells.

13. The method of claim 12, wherein setting the state of the bit line coupled to the selected memory block comprises:
applying a first program allowable voltage to a bit line coupled to the first program allowable cells; and
applying a second program allowable voltage greater than the first program allowable voltage to a bit line coupled to the second program allowable cells.

14. The method of claim 13, wherein setting the state of the bit line coupled to the selected memory block including the selected memory cells further comprises applying a program inhibit voltage greater than the second program allowable voltage to a bit line coupled to the program inhibit cells.

15. A semiconductor memory device comprising:
a memory block including a plurality of memory cells each capable of storing N bits of data, wherein N is a natural number greater than 1;
a peripheral circuit configured to perform a program operation on selected memory cells among the plurality of memory cells included in the memory block; and
a control logic circuit configured to control the program operation performed on the selected memory cells,
wherein the program operation includes a plurality of program loops each including a program phase and a verify phase, and
wherein, in the program phase, the control logic circuit is configured to control the peripheral circuit to:
apply a first voltage or a second voltage to a select line coupled to the memory block based on a number of times the plurality of program loops is performed;
set a state of a bit line coupled to a selected memory block;

apply a program voltage to a selected word line among word lines coupled to the selected memory block while the first voltage or the second voltage is applied to the select line; and apply a pass voltage to an unselected word line.

16. The semiconductor memory device of claim 15, wherein the control logic circuit is configured to control the peripheral circuit to apply the first voltage or the second voltage to the select line by checking program states of which a program is completed in the verify phase of an immediately previous program loop, and controlling the peripheral circuit to apply the first voltage to the select line, when a program of memory cells to be programmed to an i-th program state is not completed among first to $(2^N-1)$-th program states, and wherein i is a natural number greater than 0 and less than $(2^N-1)$.

17. The semiconductor memory device of claim 16, wherein the control logic circuit is configured to control the peripheral circuit to apply the second voltage different from the first voltage to the select line, when the program of the memory cells to be programmed to the i-th program state is completed.

18. The semiconductor memory device of claim 17, wherein:

the select line is a drain select line; and the second voltage is less than the first voltage.

19. The semiconductor memory device of claim 15, wherein the control logic circuit is configured to, in the verify phase:

control the peripheral circuit to apply a pre-verify voltage to a word line coupled to the selected memory cells and apply a main verify voltage greater than the pre-verify voltage to the word line coupled to the selected memory cells;

determine memory cells having a threshold voltage higher than the main verify voltage as program inhibit cells;

determine memory cells having a threshold voltage lower than the pre-verify voltage as first program allowable cells; and determine memory cells having a threshold voltage higher than the pre-verify voltage and lower than the main verify voltage as second program allowable cells.

20. The semiconductor memory device of claim 19, wherein the control logic circuit is configured to, in a process of setting the state of the bit line coupled to the selected memory block, control the peripheral circuit to:

apply a first program allowable voltage to a bit line coupled to the first program allowable cells;

apply a second program allowable voltage greater than the first program allowable voltage to a bit line coupled to the second program allowable cells; and apply a program inhibit voltage greater than the second program allowable voltage to a bit line coupled to the program inhibit cells.

* * * * *